(12) United States Patent
Liang et al.

(10) Patent No.: US 9,819,145 B2
(45) Date of Patent: Nov. 14, 2017

(54) LASER AND INTEGRATED GRAPHENE MODULATOR

(71) Applicant: Nanyang Technological University, Singapore (SG)

(72) Inventors: Guozhen Liang, Singapore (SG); Qijie Wang, Singapore (SG)

(73) Assignee: Nanyang Technological University, Singapore (SG)

( * ) Notice: Subject to any disclaimer, the term of this patent is extended or adjusted under 35 U.S.C. 154(b) by 0 days.

(21) Appl. No.: 14/884,371

(22) Filed: Oct. 15, 2015

(65) Prior Publication Data

US 2016/0141835 A1   May 19, 2016

(30) Foreign Application Priority Data

Nov. 14, 2014 (SG) .............................. 10201407606P

(51) Int. Cl.
| | | |
|---|---|---|
| H01S 5/12 | (2006.01) | |
| H01S 5/042 | (2006.01) | |
| H01S 5/026 | (2006.01) | |
| H01S 5/183 | (2006.01) | |
| H01S 5/34 | (2006.01) | |

(52) U.S. Cl.
CPC .......... *H01S 5/0425* (2013.01); *H01S 5/0265* (2013.01); *H01S 5/18302* (2013.01); *H01S 5/18386* (2013.01); *H01S 5/18375* (2013.01); *H01S 5/3401* (2013.01); *H01S 2302/02* (2013.01)

(58) Field of Classification Search
CPC ............. H01S 5/18302; H01S 5/18386; H01S 5/3401; H01S 5/0265; H01S 2302/02
See application file for complete search history.

(56) References Cited

U.S. PATENT DOCUMENTS

2007/0002917 A1*   1/2007   Deng ................. H01S 5/18302
                                                              372/50.11
2013/0342279 A1*  12/2013   Sensale-Rodriguez .. H03C 7/00
                                                              332/179

OTHER PUBLICATIONS

Adam et al., "A Self-Consistent Theory for Graphene Transport," *Proceedings of the National Academy of Sciences of the United States of America* 104(47):18392-18397, 2007.

Cai et al., "Sensitive room-temperatures terahertz detection via the photothermoelectric effect in graphene," *Nature Nanotechnology* 9:814-819, 2014.

Chan et al., "Imaging with terahertz radiation," *Reports on Progress in Physics* 70(8):1325-1379, 2007.

Chen et al., "Active terahertz metamaterial devices," *Nature* 444(7119):597-600, 2006.

Chen et al., "Wireless communication demonstration at 4.1 THz using quantum cascade laser and quantum well photodetector," *Electronics Letters* 47(17):1002-1004, 2011.

Chen et al., "Efficient real-time detection of terahertz pulse radiation based on photoacoustic conversion by carbon nanotube nanocomposite," *Nature Photonics* 8(7):537-542, 2014.

(Continued)

*Primary Examiner* — Tod T Van Roy
(74) *Attorney, Agent, or Firm* — Seed IP Law Group LLP

(57) ABSTRACT

According to various embodiments, there is provided a layer arrangement including a graphene layer; a gating electrode layer configured to provide a tuning voltage to the graphene layer; a laser layer configured to provide an electromagnetic wave; and a concentric-circular grating layer configured to couple the electromagnetic wave to the graphene layer.

22 Claims, 18 Drawing Sheets

(56) References Cited

OTHER PUBLICATIONS

Choi et al., "A terahertz metamaterial with unnaturally high refractive index," *Nature* 470(7334):369-373, 2011.
Efetov et al., "Controlling Electron-Phonon Interactions in Graphene at Ultrahigh Carrier Densities," *Physical Review Letters* 105(25):256805, 2010. (4 pages).
Federici et al., "THz imaging and sensing for security application—explosives, weapons and drugs," *Semiconductor Science and Technology* 20(7): S266-S280, 2005.
Frickey, "Conversions between S, Z, Y,h, ABCD, and T Parameters which are Valid for Complex Source and Load Impedances," *IEEE Transactions on Microwave Theory and Techniques* 42(2):205-211, 1994.
Gao et al., "High-Contrast Terahertz Wave Modulation by Gated Graphene Enhanced by Extraordinary Transmission through Ring Apertures," *Nano Letters* 14(3):1242-1248, 2014.
Hsu et al., "Impact of Graphene Interface Quality on Contact Resistance and RF Device Performance," *IEEE Electron Device Letters* 32(8):1008-1010, 2011.
Hu, "Terahertz Quantum Cascade Lasers and Real-time T-rays Imaging at video rate," *Terahertz Science and Technology* 2(4):120-130, 2009.
Jung et al., "Broadly tunable monolithic room-temperature terahertz quantum cascade laser sources," *Nature Communications* 5:4267, 2014, 7 pages.
Kim et al., "Biomedical terahertz imaging with a quantum cascade laser," *Applied Physics Letters* 88(15):153903, 2006, 4 pages.
Kim et al., "Realization of a high mobility dual-gated graphene field-effect transistor with $Al_2O_3$ dielectric," *Applied Physics Letters* 94:062107, 2009, 4 pages.
Kleine-Ostmann et al., "Room-temperature operation of an electrically driven terahertz modulator," *Applied Physics Letters* 84:3555, 2004, 4 pages.
Kleine-Ostmann et al., "A Review on Terahertz Communications Research," *Journal of Infrared, Millimeter, and Terahertz Waves* 32(2):143-171, 2011.
Koenig et al., "Wireless sub-THz communication system with high data rate," *Nature Photonics* 7(12):977-981, 2013.
Kölher et al., "Terahertz semiconductor-heterostructure laser," *Nature* 417(6885):156-159, 2002.
Lee et al., "Real-time terahertz imaging over a standoff distance (> 25 meters)," *Applied Physics Letters* 89:141125, 2006, 4 pages.
Lee et al., "Switching terahertz waves with gate-controlled active graphene metamaterials," *Nature Materials* 11(11):936-941, 2012.
Leong et al., "Low-Contact-Resistance Graphene Devices with Nickel-Etched-Graphene Contacts," *ACS NANO* 8(1):994-1001, 2014.
Liang et al., "Low divergence single-mode surface-emitting concentric-circular-grating terahertz quantum cascade lasers," *Optics Express* 21(26): 31872-31882, 2013.
Liang et al., "Single-mode surface-emitting concentric-circular-grating terahertz quantum cascade lasers," *Applied Physics Letters* 102:03119, 2013, 5 pages.
Liao et al., "High-κ oxide nanoribbons as gate dielectrics for high mobility top-gated graphene transistors," *Proceedings of the National Academy of Sciences* 107(5):6711-6715, 2010.
Liu et al., "Terahertz quantum-well photodetector," *Applied Physics Letters* 84:4068, 2004, 4 pages.
Mittleman et al., "Gas sensing using terahertz time-domain spectroscopy," *Applied Physics B: Lasers and Optics* 67(3):379-390, 1998.
Nguyen et al., "Three-dimensional imaging with a terahertz quantum cascade laser," *Optics Express* 14(6):2123-2129, 2006.
Ren et al, "High-resolution heterodyne spectroscopy using a tunable quantum cascade laser around 3.5 THz," *Applied Physics Letters* 98:231109, 2011, 4 pages.
Ren et al., "Terahertz and Infrared Spectroscopy of Gated Large-Area Graphene," *Nano Letters* 12(7):3711-3715, 2012.
Sensale-Rodriguez et al., "Broadband graphene terahertz modulators enabled by intraband transitions," *Nature Communications* 3:780, 2012, 7 pages.
Sensale-Rodriguez et al., "Extraordinary control of Terahertz Beam Reflectance in Graphene Electro-absorption Modulators," *Nano Letters* 12(9):4518-4522, 2012.
Shrekenhamer et al., "High speed terahertz modulation from metamaterials with embedded high electron mobility transistors," *Optics Express* 19(10):9968-9975, 2011.
Smith et al., "Reducing Contact Resistance in Graphene Devices through Contact Area Patterning," *ACS nano* 7(4):3661-3667, 2013.
Valmorra et al., "Low-Bias Active Control of Terahertz Waves by Coupling Large-Area CVD Graphene to a Terahertz Metamaterial," *Nano Letters* 13(7):3193-3198, 2013.
Vicarelli et al., "Graphene field-effect transistors as room-temperature terahertz detectors," *Nature Materials* 11(10):865-871, 2012.
Watts et al., "Terahertz compressive imaging with metamaterial spatial light modulators," *Nature Photonics* 8:605-609, 2014.

* cited by examiner

LASER AND INTEGRATED GRAPHENE MODULATOR

CROSS-REFERENCE TO RELATED APPLICATIONS

This application claims the benefit of Singapore Patent Application number 10201407606P filed 14 Nov. 2014, the entire contents of which are incorporated herein by reference for all purposes.

TECHNICAL FIELD

The present invention relates to layer arrangements and methods for fabricating thereof.

BACKGROUND

The electromagnetic spectrum band of between about 0.3 THz to 10 THz is often referred to as the "terahertz (THz) gap" due to the difficulties in efficiently generating, manipulating and detecting THz radiation. THz electromagnetic waves may be applied to a diverse range of applications, ranging from non-destructive imaging, spectroscopic sensing, to ultra-high bit rate wireless communication. An optical modulator is a key component widely used for beam manipulation, imaging, optical communication, as well as active mode locking and others. However, in the THz spectrum, the development of fast and efficient modulators is lagging behind.

Previous attempts to build a THz modulator include the use of a two-dimensional electron gas (2 DEG) in semiconductor structures whose electrons can be injected or depleted by an applied gate voltage. However, these solutions can only modulate the THz wave amplitude by a few percent. By incorporating metamaterials or plasmonic structures to enhance the interaction between the incoming light and the 2 DEG, the modulation depth may be increased to 30%. Ultimately, the modulation depth of these devices may be limited by the achievable tunability in electron gas density (up to ~$1 \times 10^{12}$ $cm^{-2}$ for 2 DEG or bulk semiconductor). Other solutions may include electrically gating a large-area graphene sheet, which may achieve a modulation depth of about 15%. By taking advantage of the electric field enhancement effect in an optical cavity, plasmonic structure or metamaterials, modulation depth of 64% may be achieved in graphene-based THz modulators. However, further improvement remains difficult. In addition, the available graphene modulators were studied as isolated components, of which a large active area of several millimeters by several millimeters may be typical to facilitate optical arrangement. The consequent large time constant of the effective resistor-capacitor (RC) circuit of the device package may limit the modulation speed of these graphene modulators to only about 13 MHz, at the same level of those of their semiconductor counterparts, despite the ultra-high intrinsic carrier mobility of graphene (>20,000 $cm^2V^{-1}$ $s^{-1}$ for graphene on $SiO_2$).

Therefore, there is a need for an improved graphene modulator that may be able to achieve a better modulation depth and a faster modulation speed, as compared to existing modulators.

SUMMARY

According to various embodiments, there may be provided a layer arrangement including a graphene layer; a gating electrode layer configured to provide a tuning voltage to the graphene layer; a laser layer configured to provide an electromagnetic wave; and a concentric-circular grating layer configured to couple the electromagnetic wave to the graphene layer.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments are described with reference to the following drawings, in which.

DESCRIPTION

Figure 1A:
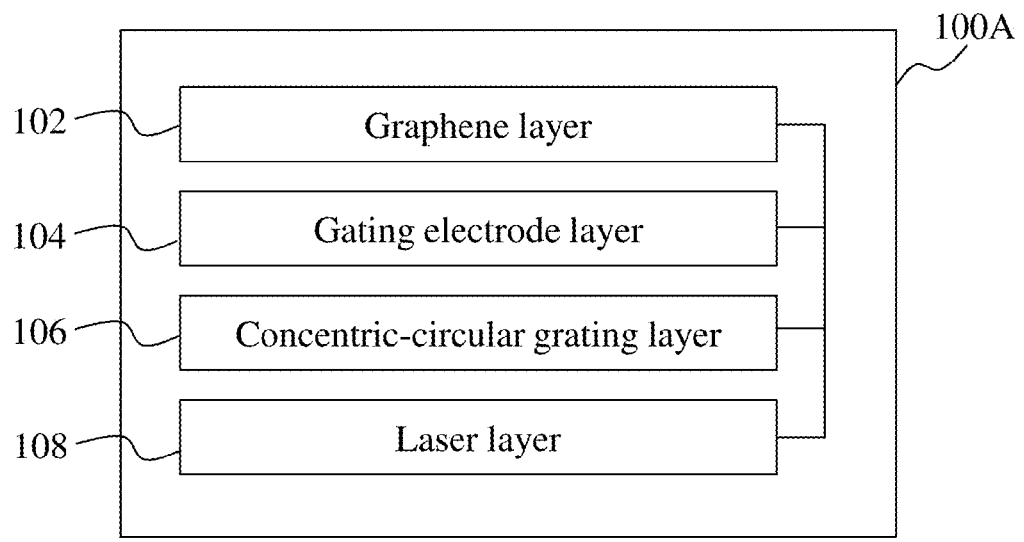
FIG. 1A shows a conceptual diagram of a layer arrangement according to various embodiments.

Embodiments described below in context of the devices are analogously valid for the respective methods, and vice versa. Furthermore, it will be understood that the embodiments described below may be combined, for example, a part of one embodiment may be combined with a part of another embodiment.

It should be appreciated and understood that the term "substantially" may include "exactly" and "similar" which is to an extent that it may be perceived as being "exact". For illustration purposes only and not as a limiting example, the term "substantially" may be quantified as a variance of +/−5% from the exact or actual.

In the specification the term "comprising" shall be understood to have a broad meaning similar to the term "including". This definition also applies to variations on the term "comprising" such as "comprise" and "comprises".

The term "coupled" (or "connected") herein may be understood as optically coupled or as electrically coupled or as mechanically coupled, for example attached or fixed, or just in contact without any fixation, and it will be understood that both direct coupling or indirect coupling (in other words: coupling without direct contact) may be provided.

In the context of various embodiments, "layer arrangement" may be but is not limited to being interchangeably referred to as an "integrated graphene modulator" or an "integrated modulator".

In the context of various embodiments, "graphene layer" may be but is not limited to being interchangeably referred to as a "graphene sheet".

In the context of various embodiments, "gating electrode layer" may be but is not limited to being interchangeably referred to as a "gate electrode" or a "graphene electrode" or a "back gate electrode".

In the context of various embodiments, "spoke bridge" may be but is not limited to being interchangeably referred to as a "spoke structure" or a "spoke-like metal bridge".

In the context of various embodiments, "gate voltage" may be but is not limited to being interchangeably referred to as a "graphene voltage" or a "gating voltage" or "$V_G$".

In order that the invention may be readily understood and put into practical effect, particular embodiments will now be described by way of examples and not limitations, and with reference to the figures.

Various embodiments are provided for devices, and various embodiments are provided for methods. It will be understood that basic properties of the devices also hold for the methods and vice versa. Therefore, for sake of brevity, duplicate description of such properties may be omitted.

It will be understood that any property described herein for a specific device may also hold for any device described herein. It will be understood that any property described herein for a specific method may also hold for any method described herein. Furthermore, it will be understood that for any device or method described herein, not necessarily all the components or steps described must be enclosed in the device or method, but only some (but not all) components or steps may be enclosed.

The electromagnetic spectrum band of between about 0.3 THz to 10 THz is often referred to as the "terahertz (THz) gap" due to the difficulties in efficiently generating, manipulating and detecting THz radiation. THz electromagnetic waves may be applied to a diverse range of applications, ranging from non-destructive imaging, spectroscopic sensing, to ultra-high bit rate wireless communication. Optical modulator is a key component widely used for beam manipulation, imaging, optical communication, as well as active mode locking and others. However, in the THz spectrum, the development of fast and efficient modulators is lagging behind.

Previous attempts to build a THz modulator include the use of a two-dimensional electron gas (2 DEG) in semiconductor structures whose electrons can be injected or depleted by an applied gate voltage. However, these solutions can only modulate the THz wave amplitude by a few percent. By incorporating metamaterials or plasmonic structures to enhance the interaction between the incoming light and the 2 DEG, the modulation depth may be increased to 30%. Ultimately, the modulation depth of these devices may be limited by the achievable tunability in electron gas density (up to $\sim 1 \times 10^{12}$ cm$^{-2}$ for 2 DEG or bulk semiconductor). Other solutions may include electrically gating a large-area graphene sheet, which may achieve a modulation depth of about 15%. By taking advantage of the electric field enhancement effect in an optical cavity, plasmonic structure or metamaterials, modulation depth of 64% may be achieved in graphene-based THz modulators. However, further improvement remains difficult. In addition, the available graphene modulators were studied as isolated components, of which a large active area of several millimeters by several millimeters may be typical to facilitate optical arrangement. The consequent large time constant of the effective resistor-capacitor (RC) circuit of the device package may limit the modulation speed of these graphene modulators to only about 13 MHz, at the same level of those of their semiconductor counterparts, despite the ultra-high intrinsic carrier mobility of graphene (>20,000 cm$^2$V$^{-1}$ s$^{-1}$ for graphene on SiO$_2$). Therefore, there is a need for an improved graphene modulator that may be able to achieve a better modulation depth and a faster modulation speed, as compared to existing modulators.

FIG. 1A shows a conceptual diagram of a layer arrangement 100A according to various embodiments. The layer arrangement may include a graphene layer 102, a gating electrode layer 104 configured to provide a tuning voltage to the graphene layer 102, a laser layer 108 configured to provide an electromagnetic wave and a concentric-circular grating (CCG) layer 106 configured to couple the electromagnetic wave to the graphene layer 102.

In other words, according to various embodiments, a layer arrangement 100A may include a graphene layer 102, a gating electrode layer 104, a CCG layer 106 and a laser layer 108. The gating electrode layer 104 may be configured to provide a tuning voltage to the graphene layer 102. The laser layer 108 may be configured to provide an electromagnetic wave. The CCG layer 106 may be configured to couple the electromagnetic wave to the graphene layer 102. The layer arrangement 100A may be arranged such that the graphene layer 102 is provided above the gating electrode layer 104, the gating electrode layer 104 is provided above the CCG layer 106 and the CCG layer 106 is provided above the laser layer 108. The graphene layer 102 may be provided directly above the gating electrode layer 104 such that the graphene layer 102 may at least partially overlap the gating electrode layer 104. There may be nothing separating the graphene layer 102 from the gating electrode layer 104. In other words, the layer arrangement 100A may be free from a separator between the graphene layer 102 and the gating electrode layer 104. The gating electrode layer 104 may be shaped at least substantially similar to the CCG layer 106 so that the gating electrode layer 104 does not obstruct the electromagnetic wave from reaching the graphene layer 102. The CCG layer 106 may be provided directly above the laser layer 108 such that the CCG layer 106 may at least partially overlap the laser layer 108. There may be nothing separating the CCG layer 106 from the laser layer 108. In other words, the layer arrangement 100A may be free from a separator between the CCG layer 106 and the laser layer 108. The laser layer 108 may be a quantum cascade laser (QCL). The laser layer 108 may include an active region which may be at least substantially flat. The CCG layer 106 may include a plurality of concentric rings which may include a set of innermost rings. The CCG layer 106 may further include at least one spoke bridge, also referred herein as a spoke structure. The set of innermost rings may be connected through the at least one spoke bridge. The set of innermost rings connected through the at least one spoke bridge may be arranged over the active region of the laser layer 108, and may be configured to provide electrical pumping to a layer underneath the set of innermost rings. The spoke bridge may connect an outermost ring of the set of innermost rings, to each ring of the set of innermost rings. In other words, the spoke bridge may be a bridge across the plurality of rings within the set of innermost rings. The set of innermost rings connected through the at least one spoke bridge is configured to provide electrical pumping to a layer underneath the set of innermost rings. The layer underneath the set of innermost rings may be the active region of the laser layer 108. In other words, the set of innermost rings connected through the at least one spoke bridge may function as a bias electrode of the laser layer 108. The set of innermost rings may be considered to be the pumping layer of the QCL. A fixed voltage may be applied on the pumping layer when the layer arrangement 100A is in operation. The plurality of concentric rings may be a plurality of metal gratings. The CCG layer 106 may provide laser cavities in the form of distributed feedback by the gaps between the metal gratings. The graphene layer 102 may be configured to modulate the electromagnetic wave, based on the tuning voltage provided through the gating electrode layer 104. The graphene layer 102 may be configured to vary an amplitude of the electromagnetic wave based on the tuning voltage.

Figure 1B:
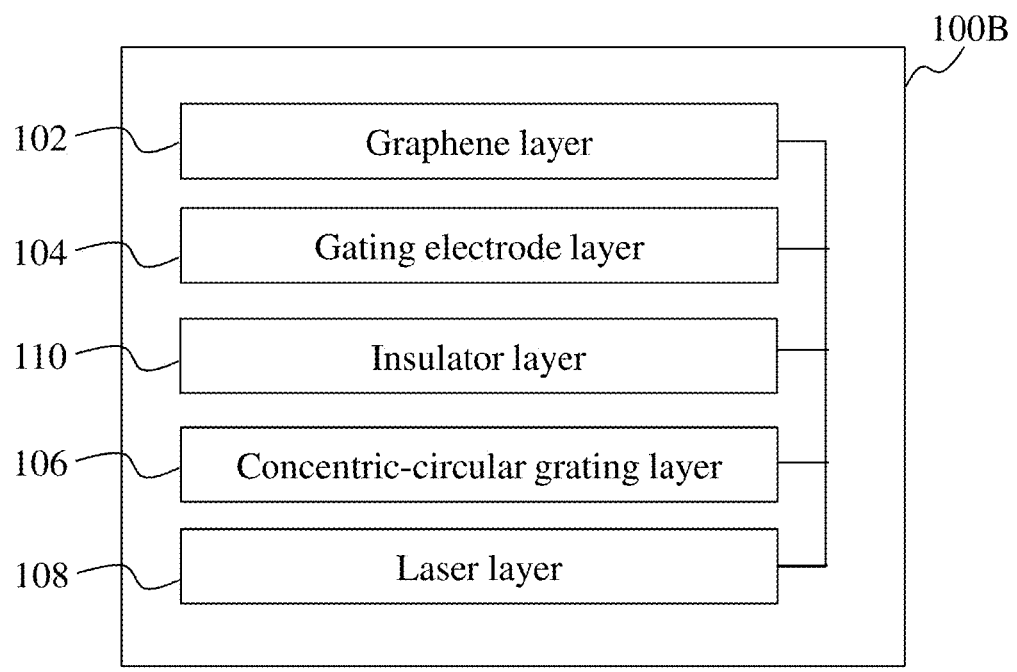
FIG. 1B shows a conceptual diagram of a layer arrangement according to various embodiments.

FIG. 1B shows a conceptual diagram of a layer arrangement 100B according to various embodiments. The layer arrangement 100B may be similar to the layer arrangement 100A of FIG. 1A, in that it includes a graphene layer 102, a gating electrode layer 104, a CCG layer 106 and a laser layer 108. The graphene layer 102, the gating electrode layer 104, the CCG layer 106 and the laser layer 108 of the layer arrangement 100B may be at least substantially identical or at least similar to the graphene layer 102, the gating electrode layer 104, the CCG layer 106 and the laser layer 108 of the layer arrangement 100A. The layer arrangement 100B may further include an insulator layer 110.

The layer arrangement 100B may be arranged such that the graphene layer 102 is provided above the gating electrode layer 104, the gating electrode layer 104 is provided above the insulator layer 110, the insulator layer 110 is provided above the CCG layer 106, and the CCG layer 106 is provided above the laser layer 108. The graphene layer 102 may be provided directly above the gating electrode layer 104 such that the graphene layer 102 may at least partially overlap the gating electrode layer 104. There may be nothing separating the graphene layer 102 from the gating electrode layer 104. In other words, the layer arrangement 100B may be free from a separator between the graphene layer 102 and the gating electrode layer 104. The gating electrode layer 104 may be provided directly above the insulator layer 110 such that the gating electrode layer 104 may at least partially overlap the insulator layer 110. There may be nothing separating the gating electrode layer 104 from the insulator layer 110. In other words, the layer arrangement 100B may be free from a separator between the gating electrode layer 104 and the insulator layer 110. The insulator layer 110 may be arranged between the CCG layer 106 and the gating electrode layer 104. The insulator layer 110 may be provided directly above the CCG layer 106 such that the insulator layer 110 may at least partially overlap the CCG layer 106. There may be nothing separating the insulator layer 110 from the CCG layer 106. In other words, the layer arrangement 100B may be free from a separator between the insulator layer 110 and the CCG layer 106. The CCG layer 106 may be coupled to the laser layer 108. The CCG layer 106 may be provided directly above the laser layer 108 such that the CCG layer 106 may at least partially overlap the laser layer 108. There may be nothing separating the CCG layer 106 from the laser layer 108. In other words, the layer arrangement 100B may be free from a separator between the CCG layer 106 and the laser layer 108. In other words, the layer arrangement 100B may include the following, arranged in a top to bottom sequence: the graphene layer 102, the gating electrode layer 104, the insulator layer 110, the CCG layer 106 and the laser layer 108. The CCG layer 106 may include a plurality of concentric rings which may include a set of innermost rings. The set of innermost rings may be connected through at least one spoke bridge. The set of innermost rings may be arranged over an active region of the laser layer 108. The set of innermost rings may be configured to provide electrical pumping to a layer underneath the set of innermost rings.

Figure 2A:
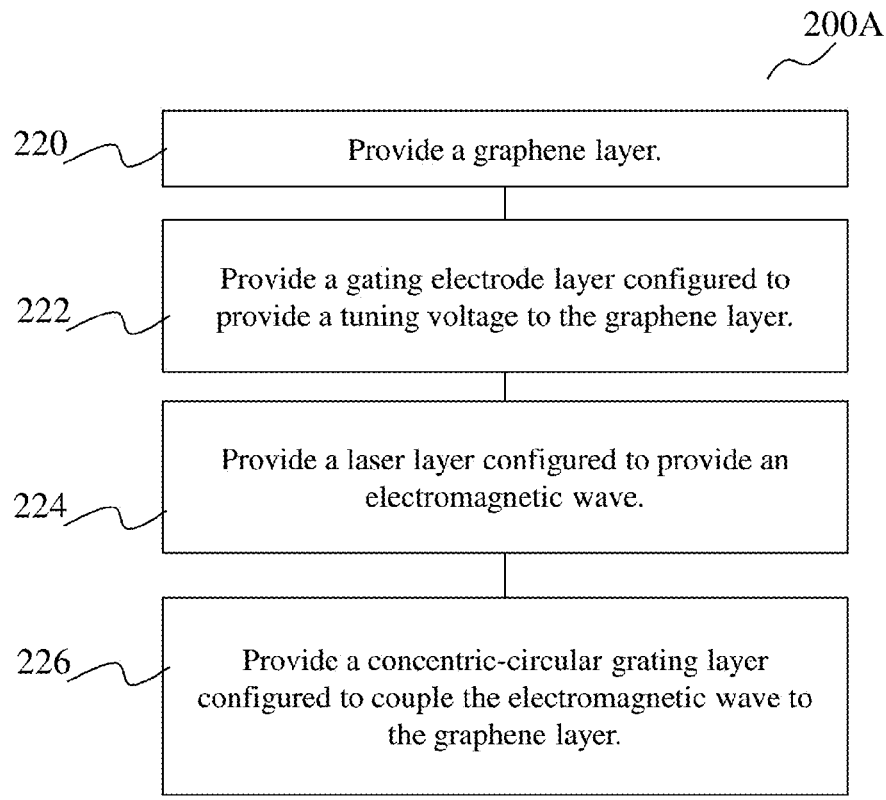
FIG. 2A shows a flow diagram of a method for fabricating a layer arrangement according to various embodiments.

FIG. 2A shows a flow diagram 200A showing a method for fabricating a layer arrangement according to various embodiments. The layer arrangement may be the layer arrangement 100A of FIG. 1A or the layer arrangement 100B of FIG. 1B. In 220, a graphene layer may be provided. In 222, a gating electrode layer may be provided. The gating electrode layer may be configured to provide a tuning voltage to the graphene layer. In 224, a laser layer may be provided. The laser layer may be configured to provide an electromagnetic wave. In 226, a CCG layer may be provided. The CCG layer may be configured to couple the electromagnetic wave to the graphene layer.

Graphene may have great promise for application in the efficient modulation of THz light. Graphene is a single layer of carbon atoms arranged in a hexagonal lattice that exhibits extraordinary electronic and optical properties. As such, the carrier concentration in graphene can be changed from a low level to as high as $1 \times 10^{14}$ cm$^{-2}$, as the Fermi level of graphene goes far away from the Dirac point by electrostatic gating. The Dirac point is also referred herein as the charge neutrality point (CNP). These properties of graphene, along with the natural perfect bi-dimensionality and flexibility of graphene, may enable easy hybridization of graphene with other material or structures. As such, graphene may be a very promising material for constructing THz modulators.

An integrated graphene modulator according to various embodiments may leverage on the above described characteristics of graphene, to provide improved performance for the modulator. The integrated graphene modulator may be miniaturized, thereby increasing the modulation speed due to reduced parasitic capacitance and resistance of the device. The integrated graphene modulator may also achieve a larger modulation depth due to the stronger interaction of the THz radiation with a graphene layer. The integrated graphene modulator may also eliminate the need for a stage of meticulous optical alignment with bulky mirrors or lenses.

An integrated graphene modulator according to various embodiments may include surface-emitting concentric-circular-grating (CCG) THz quantum cascade lasers (QCLs), as well as a graphene modulator, for achieving 100% modulation depth with a fast modulation speed. A THz QCL may be a semiconductor-based, compact and efficient THz light source. The QCL may generate coherent THz radiation in an elegant way by exploiting the electron transitions between energy levels of a superlattice in the conduction band. Moreover, steady single-mode operation with relatively high surface-emitting output power may be obtained by employing the CCG as a feedback element. By coalescing graphene together with the QCL, a 100% modulation depth may be achieved as a consequence of a strong interaction of the graphene with the laser field, which is greatly enhanced at the output apertures of the laser cavity formed by the CCG.

Figure 2B:
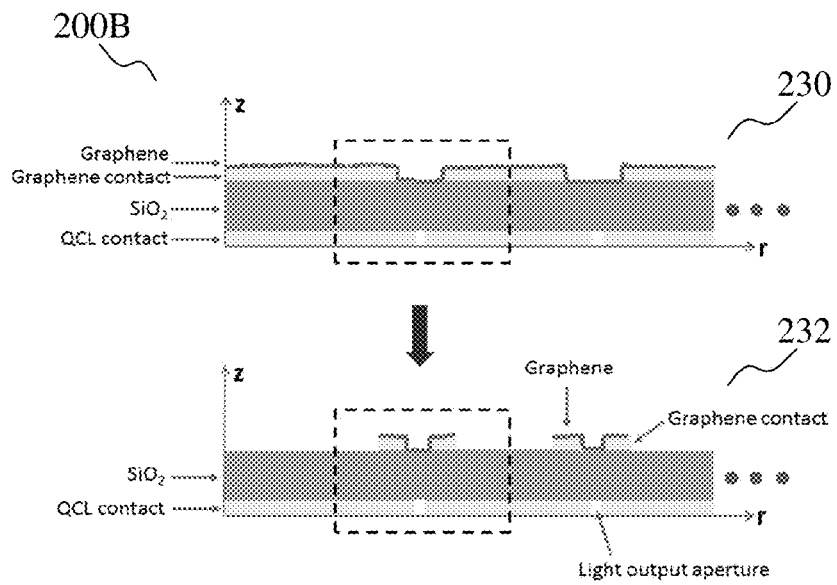
FIG. 2B shows cross-sectional schematic views of a first layer arrangement and a second layer arrangement, according to various embodiments.

FIG. 2B shows cross-sectional views 200B of a first layer arrangement 230 according to various embodiments and a second layer arrangement 232 according to various embodiments. Each of the first layer arrangement 230 and the second layer arrangement 232 may be a graphene modulator. The modulation speed of a graphene modulator may be improved by having a smaller device area and by optimization of the design of the laser cavity and the modulator architecture. The design of the laser cavity can be optimized by for example, reducing the size of the laser cavity. The modulator architecture may be optimized, by for example, reducing the capacitance of the graphene modulator. For example, the first layer arrangement 230 may be optimized for higher modulation speed, by decreasing the area of the graphene layer and the graphene contact layer to become the second layer arrangement 232. As the graphene absorption is broadband in nature, the integration scheme may be readily scaled to other wavelength regions. For example, the integration scheme may be scaled down to lower-wavelength regions such as the mid-infrared (mid-IR) regime, by monolithically integrating mid-IR QCLs with graphene. In addition, the integration scheme may enable the realization of mid-IR and THz integrated optical circuits, combined with other photonic components such as detectors, waveguides and filters, for communication, sensing and spectroscopy applications.

Figure 3:
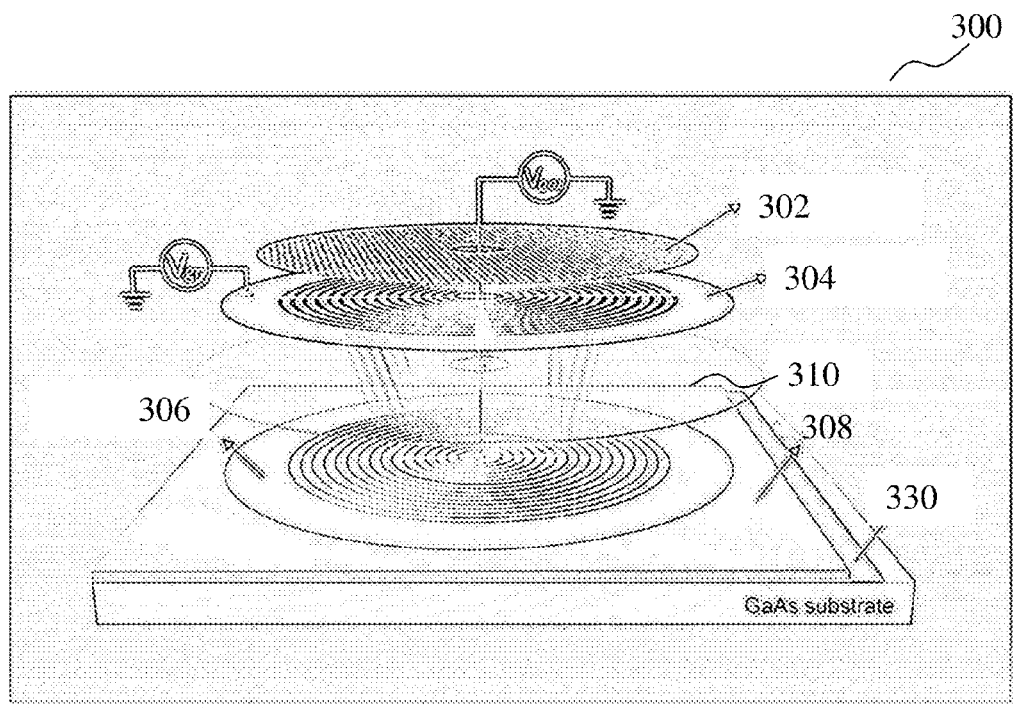
FIG. 3 shows a three-dimensional (3D) schematic illustration of a layer arrangement according to various embodiments.

FIG. 3 shows a three-dimensional (3D) schematic illustration of a layer arrangement 300, according to various embodiments. The layer arrangement 300 may be similar or at least substantially similar to the layer arrangement 100A of FIG. 1A or the layer arrangement 100B of FIG. 1B. The layer arrangement 300 may include a graphene layer 302 arranged directly over a gating electrode layer 304. The gating electrode layer 304 may be arranged directly over an insulator layer 310. The insulator layer 310 may be arranged directly over a concentric-circular grating (CCG) layer 306. The insulator layer 310 may be a silicon dioxide ($SiO_2$) layer. The insulator layer 310 may insulate a bias electrode on the CCG layer 306, from the gating electrode 304. The CCG layer 306 may be arranged over a laser layer 308. The laser layer 308 may be arranged on a metal layer 330 and the metal layer 330 may be arranged on a substrate. The metal layer 330 may be, for example a gold layer while the substrate may be, for example, a gallium arsenide (GaAs) substrate. The graphene layer 302 may be a graphene sheet. The graphene sheet may be a patterned graphene sheet. The graphene layer 302 may be identical or at least substantially similar to the graphene layer 102 of FIGS. 1A and 1B. The gating electrode layer 304 may be identical or at least substantially similar to the gating electrode layer 104 of FIGS. 1A and 1B. The CCG 306 may be identical or at least substantially similar to the CCG layer 106 of FIGS. 1A and 1B. The laser layer 308 may be identical or at least substantially similar to the laser layer 108 of FIGS. 1A and 1B. The insulator layer 310 may be identical or at least substantially similar to the insulator layer 110 of FIG. 1B.

The laser layer 308 may be a quantum cascade laser (QCL). The laser layer 308, the metal layer 330 and the CCG layer 306 may collectively form a surface-emitting CCG QCL which emits electromagnetic waves having THz frequency. The graphene layer 302 and the gating electrode layer 304 may collectively form a graphene modulator. The gating electrode layer 304 may be electrically connected to a tuning voltage $V_{gr}$, for dynamically tuning the Fermi level of the graphene layer 302.

The laser layer 308 may include an active region of the THz QCL. The active region may have a gain peak at 3 THz. The active region may be sandwiched between the metal layer 330 and the CCG layer 306. The CCG layer 306 may include metal grating and grating slits, or in other words, apertures. The CCG layer 306 may be configured as a second-order grating such that single-mode THz radiation may be emitted vertically through the grating slits. The grating slits may also be referred herein as grating apertures. The THz radiation may then be modulated by the graphene layer 302, which may be electrically gated. The active region of the QCL may be left un-etched, so as to keep the upper surface of the active region as flat as possible, to facilitate easy transfer of the graphene layer 302 onto the layer arrangement 300. As such, the laser cavity of the layer arrangement 300 may be formed merely by the CCG layer 306.

The metal gratings of the CCG layer 306 may be a plurality of concentric rings. The plurality of concentric rings may include a set of innermost rings, which can be the centre-most concentric rings. The set of innermost rings may be connected together with spoke-like metal bridges to allow electrical pumping over the active region of the laser layer 308 underneath the set of innermost rings. The spoke-like metal bridges may also be referred herein as spoke bridges or spoke structures. The electrical pumping may be limited to only the portion of the laser layer 308 that is underneath the set of innermost rings. By having only the set of innermost rings connected together through the spoke bridges, the CCG layer 306 may be partially driven instead of being driven entirely. Partially driving the CCG layer 306 may only require a few amperes of electric current, whereas driving the entire CCG layer 306 may require an unreasonably high electric current. The optical modes may be confined within the pumped area so that the laser layer 308 may maintain a low enough threshold current for lasing action. The graphene layer 302 may be arranged on top of the gating electrode layer 304, instead of below the gating electrode layer 304, so as to reduce the difficulty in fabricating the gating electrode layer 304.

Figure 4A:
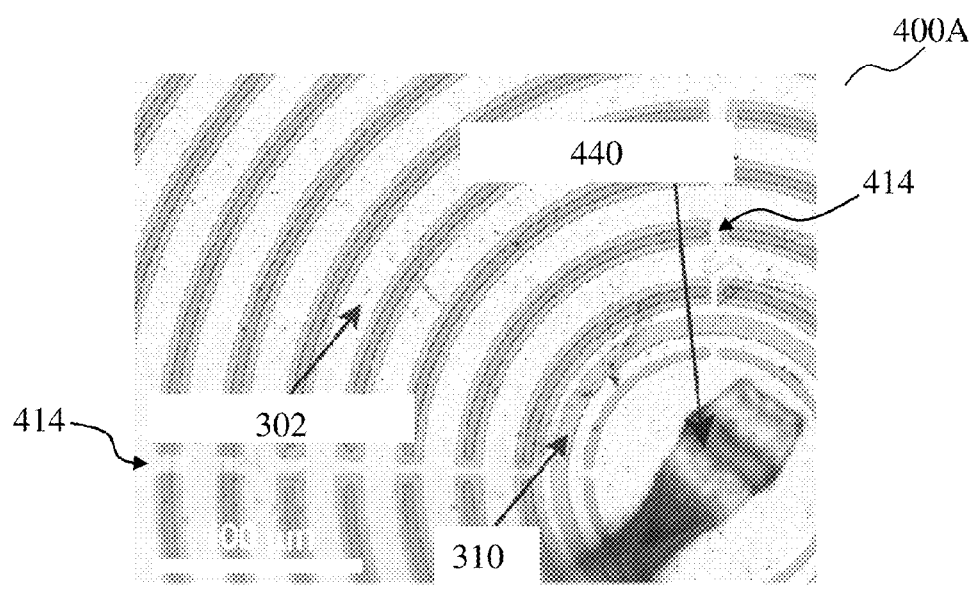
FIG. 4A shows an optical microscope image showing a central part of the layer arrangement of FIG. 3.

FIG. 4A shows an optical microscope image 400A showing a central part of the layer arrangement 300 of FIG. 3. In the optical microscope image 400A, the insulator layer 310 and the graphene layer 302 of FIG. 3 are visible. The optical microscope image 400A also shows a bonded wire 440 and spoke bridges 414. The bonded wire 440 may be a gold wire. The bonded wire 440 may be used to electrically drive the laser layer. The image 400A also shows the plurality of concentric rings of the CCG layer. The innermost rings of the CCG layer are connected by the spoke bridges 414. As the bond wire 440 is bonded in the center, only the innermost rings that are connected by the spoke bridges are electrically activated when the bond wire carries an electric current to the layer arrangement. The outer rings which are not connected by the spoke bridges, are not connected to the electric source. The innermost rings connected by the spoke bridges 414 form a bias electrode on the CCG layer. By having the spoke bridges connect only the innermost rings of the CCG layer, the laser layer can be pumped at only the central region with a reasonable current. If all the rings of the CCG layer are connected, the required pumping current may be unreasonably high as all of the area of the laser layer underneath the CCG layer will need to be pumped.

Figure 4B:
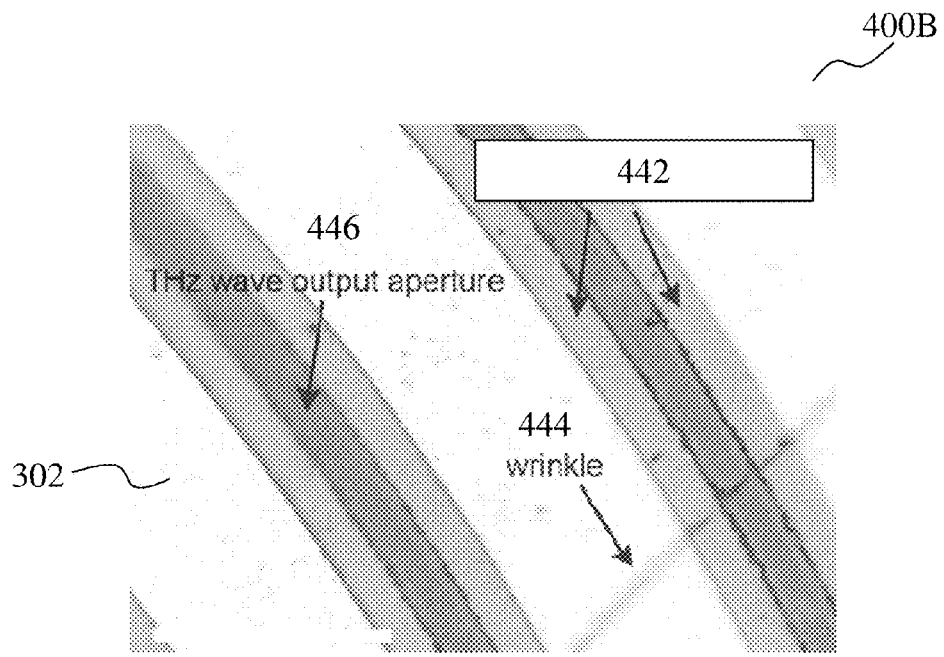
FIG. 4B shows an enlarged view of the optical microscope image of FIG. 4A.

FIG. 4B shows an enlarged view 400B of the optical microscope image 400A of FIG. 4A. The enlarged view 400B shows details of the graphene layer 302 and the bias electrode 442, which are insulated by the insulator layer. The insulator layer may be at least substantially equal to 450 nm in thickness. In the enlarged view 400B, a wrinkle is visible at the lower right corner. A wrinkle 444 is one of the typical features of transferred chemical vapor deposition (CVD) graphene. The wrinkle 444 may have resulted from folding of the transferred CVD-grown graphene. An output aperture 446 of the CCG layer is also visible, in between the gratings of the CCG layer.

In the following, separate characterizations of a CCG QCL and a graphene modulator according to various embodiments will be described.

Figure 5:
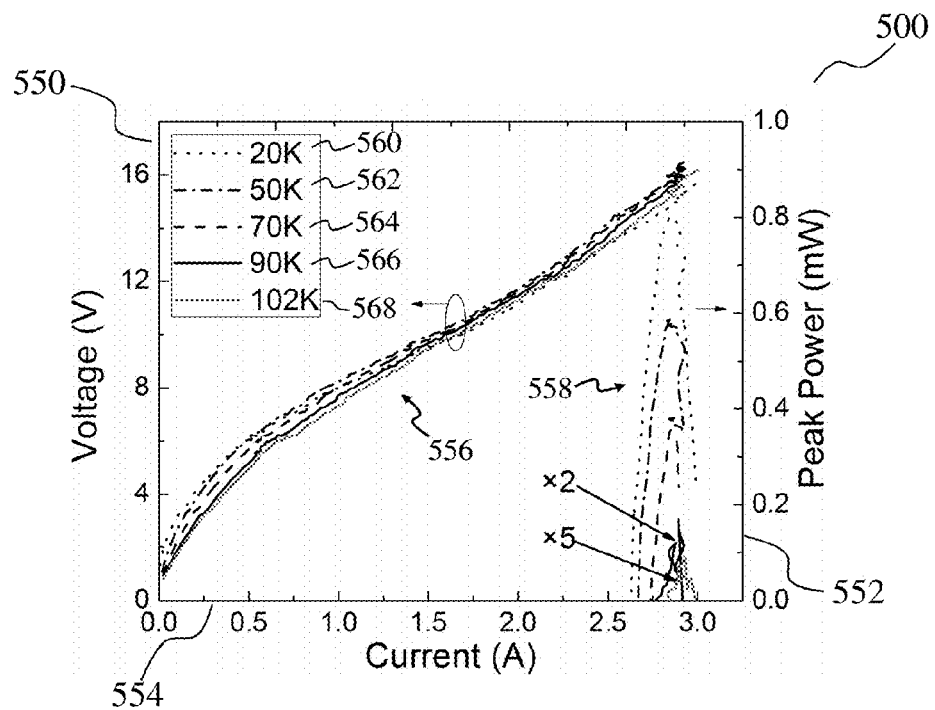
FIG. 5 shows a graph showing light-current-voltage (LIV) characteristics of a CCG QCL according to various embodiments.

FIG. 5 shows a graph 500 showing light-current-voltage (LIV) characteristics of a CCG QCL according to various embodiments, at different heat sink temperatures. Characterization of the CCG QCL can be carried out with the gating electrode layer unconnected, in other words, with the gating electrode layer floating. The QCL can be lased under a pulse mode with 500 ns pulse width and 10 kHz repetition rate, up to a 102 K heat sink temperature. In comparison, a typical ridge laser of about 200 μm wide and 1.5 mm long, fabricated from the same QCL wafer, can be operated at about 135K. Surface emitting single mode lasing was obtained at a plurality of temperatures and pump currents. The graph 500 includes a first vertical axis 550 indicating voltage in volts, a second vertical axis 552 indicating peak power in miliwatts and a horizontal axis 554 indicating current in amperes. The graph 500 includes a first series of plots 556 and a second series of plots 558. Each of the first series of plots 556 and the second series of plots 558 include a first line 560 representing the LIV characteristics at heat sink temperature of 20 K, a second line 562 representing the LIV characteristics at heat sink temperature of 50 K, a third line 564 representing the LIV characteristics at heat sink temperature of 70 K, a fourth line 566 representing the LIV characteristics at heat sink temperature of 90 K and a fifth line 568 representing the LIV characteristics at heat sink temperature of 102 K. The first series of plots 556 show the relationship between voltage and current; while the second series of plots 558 show the relationship between peak power and current. The fourth line 566 and the fifth line 568 of the second series of plots 558 have their values multiplied by two times and five times respectively, for better visibility in the graph 500. As shown in the graph 500, the LIV characteristics of the CCG QCL may be fairly consistent over a wide range of temperatures.

Figure 6:
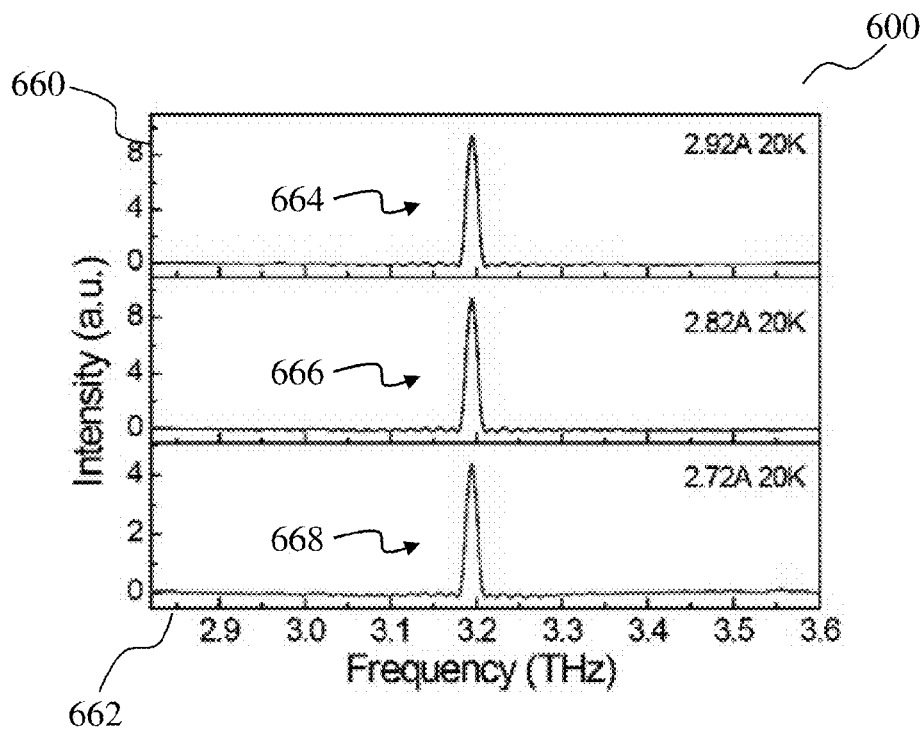
FIG. 6 shows a graph showing laser spectra at three different currents at a heat sink temperature of 20 K.

FIG. 6 shows a graph 600 showing a laser spectra at three different currents at a heat sink temperature of 20 K, for a THz CCG QCL according to various embodiments. In other words, the graph 600 shows the laser spectra as a function of pump current I, at 20 K. The graph 600 shows a single-mode operation over the whole dynamic range of the THz CCG QCL. The graph 600 includes a vertical axis 660 indicating intensity in arbitrary units (a.u.) and a horizontal axis 662 indicating frequency in THz. The graph 600 also includes a first plot 664 representing the relationship between intensity and frequency when current is 2.92 A; a second plot 666 representing the relationship between intensity and frequency when current is 2.82 A; and a third plot 668 representing the relationship between intensity and frequency when current is 2.72 A. As shown in the graph 600, the output of the CCG QCL may be single-mode over the entire range of currents.

Figure 7:
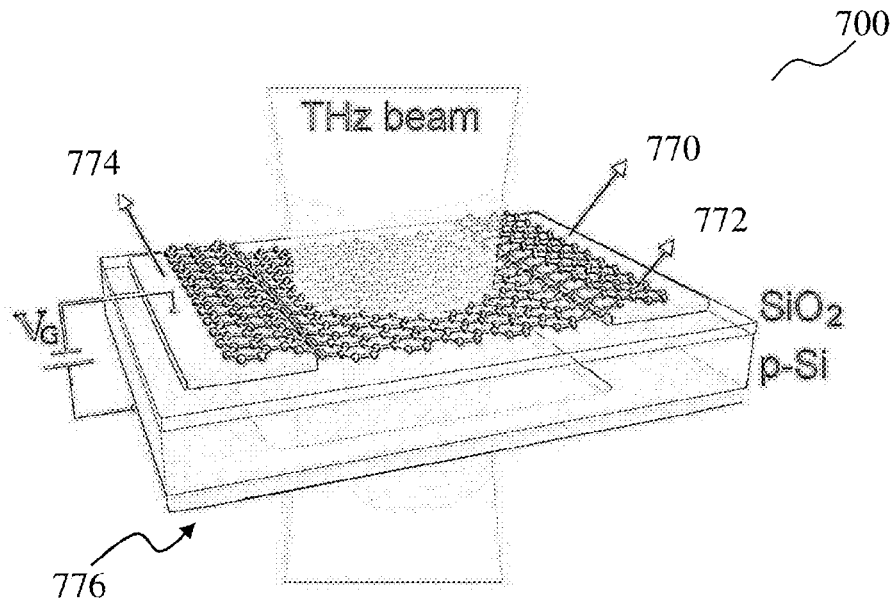
FIG. 7 shows a schematic structure of a standalone graphene modulator used to characterize a graphene layer according to various embodiments.

FIG. 7 shows a schematic structure of a standalone graphene modulator 700 used to characterize a graphene layer according to various embodiments. The standalone graphene modulator 700 may include a graphene layer 772 arranged over a substrate. The substrate may be a layer of silicon dioxide on top of a p-silicon, and may be referred herein as the $SiO_2$/Si substrate. The standalone graphene modulator 700 may further include a drain electrode 770, a source electrode 774 and a gate electrode 776, also referred herein as a back gate electrode. The gate electrode 776 may be a bottom gate metal layer under the graphene layer 772. The gate electrode 776 may include an opening for a radiation beam to pass through. The standalone graphene modulator 700 may be used to characterize the chemical vapor deposition (CVD) graphene transferred onto the QCL surface in a layer arrangement according to various embodiments.

The standalone graphene modulator 700 can be fabricated, using a graphene layer 772 that is part of the same large-area CVD graphene sheet as that used for the layer arrangement. To prepare the graphene layer 772 or also referred herein as graphene film, a commercially available CVD graphene on copper foil can be spin-coated with a polymethyl-methacrylate (PMMA) film, which can then be fully cured in a 110° C. oven for five minutes resulting in a PMMA thickness of about 1 μm. The copper substrate can be etched by letting the PMMA/graphene/copper sheet float on an ammonium persulfate (0.1 M, Sigma Aldrich) solution for more than three hours. After rinsing the etchant residue in water, the PMMA/graphene film can be ready for transfer. A 450-nm-thick $SiO_2$ layer, similar to the insulator layer on top of the QCL, can be blanket deposited on a p-type lightly doped Si substrate with a resistivity of 1-20 Ω·cm, using plasmon enhanced CVD (PECVD) method. The source electrode 774, the drain electrode 770 and the gate electrode 776 can be formed by electron-beam evaporation. The gate electrode 776 may also be referred to as a back electrode. After forming of the source electrode 774, the drain electrode 770 and the gate electrode 776, the PMMA/graphene film (1 cm×1 cm) can be transferred over to come into contact with the source electrode 774 and the drain electrode 770. The sample can be dried in air, followed by an annealing process in nitrogen atmosphere at 160° C. for 3 hours. The PMMA layer can then be dissolved in acetone, to obtain the isolated or in other words, standalone graphene modulator. Raman spectroscopy can be used to confirm that the graphene sheet after the transfer is of high quality and is a monolayer.

Figure 8:
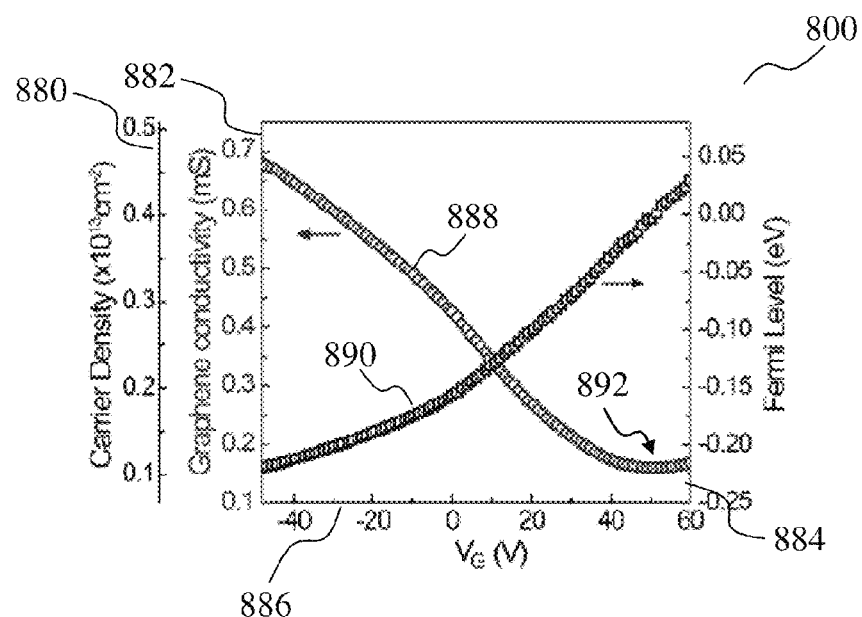
FIG. 8 shows a graph showing the DC conductivity, carrier density and Fermi level of the standalone graphene modulator of FIG. 7, as a function of the gate voltage.

FIG. 8 shows a graph 800 showing the DC conductivity, carrier density and Fermi level of the standalone graphene modulator 700 of FIG. 7, as a function of the gate voltage, measured at 78 K temperature. As QCL-integrated devices may be operated under cryogenic conditions, the electric transfer and optical absorption properties of the graphene sheet was therefore evaluated at a temperature of 78 K, which may be the temperature of a QCL surface and active region when the QCL is working at a heat sink temperature of about 20 K. The temperature of the QCL surface and the active region is usually several tens of K higher than that of the heat sink, when the QCL is operating. The graph 800 includes a first vertical axis 880 indicating carrier density in $\times 10^{13}$ cm$^{-2}$; a second vertical axis 882 indicating graphene conductivity in mS; a third vertical axis 884 indicating Fermi energy in eV; and a horizontal axis 886 indicating the gate voltage $V_G$ in volts. The graph 800 further includes a first plot 888 representing graphene conductivity and a second plot 890 representing Fermi energy of the graphene. The graph 800 may be obtained using a simple model to fit the gate-voltage-dependent sheet resistance of the graphene. The first plot 888 shows that the graphene conductivity decreases with increasing $V_G$ bias, up to the Dirac point 892 at $V_G$ being approximately equal to 50V, confirming the inherent p-type doping of the CVD graphene. As $V_G$ is increased from −40 V to +60 V, the graphene conductivity can vary from 0.65 mS to 0.16 mS while the carrier density can vary from 0.1×10$^{13}$ cm$^{-2}$ to 0.45×10$^{13}$ cm$^{-2}$. The non-zero conductivity at the Dirac point 892 may be due to a residual carrier concentration of 0.1×10$^{13}$ cm$^{-2}$ as a result of charged impurities within the standalone graphene modulator 700. Correspondingly, the Fermi level can be tuned from −230 meV to +20 meV.

The tuning range of the Fermi level, and thus the carrier concentration, may be relatively small compared to the highest achievable value in graphene. While the use of a back gate structure which features a relatively small capacitance may limit the range of carrier density and Fermi energy tuning, a top gating scheme may realize a carrier density as high as 10$^{13}$ to 10$^{14}$ cm$^{-2}$. Despite the relatively small tuning range of the popular back gating method, the tunability of the carrier density in graphene may still be much larger than that achievable in 2 DEGs arising from semiconductor heterostructures such as bulk semiconductor or quantum wells. As the optical absorption of graphene in the THz region is dominated by intraband optical transitions, in other words free carrier absorption, this larger tunability in carrier density, along with the generally high mobility of graphene, makes graphene a much more efficient THz wave modulator over alternative semiconductor devices. In the example of FIG. 8, the graphene mobility is about 900 cm$^2$V$^{-1}$ s$^{-1}$ at 78K.

Figure 9:
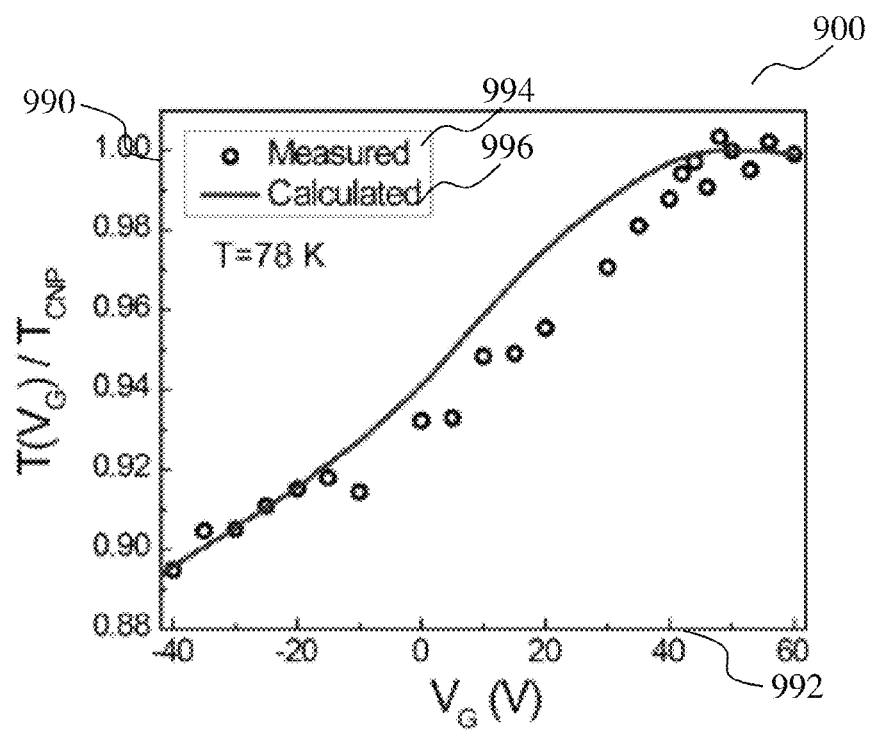
FIG. 9 shows a graph showing the gate voltage dependence of the modulation of the THz wave at temperature of 78K, for the standalone graphene modulator of FIG. 7.

FIG. 9 shows a graph 900 showing the gate voltage dependence of the modulation of the THz wave at temperature of 78K, for the standalone graphene modulator 700 of FIG. 7. The graph 900 shows that the gate voltage dependence of the modulation of the THz transmitted intensity at about 3 THz by the graphene, showing a modulation depth of about 11% over the applied bias range from −40V to 60V. The graph 900 includes a vertical axis 990 indicating a ratio of the transmission coefficient at gate voltage, $T(V_G)$ to the transmission coefficient at charge neutrality point $T_{CNP}$; and a horizontal axis 992 indicating the gate voltage $V_G$ in volts. In other words, the vertical axis 990 indicates the transmission at gate voltage, normalized to the maximum light transmission at the Dirac point, $T_{Dir}$, also referred herein as the charge neutrality point $T_{CNP}$. The graph further includes a first plot 994 representing measured results and a second plot 996 representing calculated results. Normalized to the light transmission at the Dirac point $T_{CNP}$, a modulation depth of about 11% in transmitted power ($T(V_g)/T_{Dir}$) was observed for the graphene modulator 700 upon sweeping the gate voltage from −40 V to +60 V, measured at 78 K temperature using a standard ridge QCL lasing at ~3.0 THz as a radiation or light source. The QCL may be fabricated from the same wafer or active region as that used for the CCG QCL of the integrated device. The effect of the Si substrate on the experimentally measured modulation has been removed using a transfer matrix method in generating the graph 900. The modulation depth before removal of this substrate effect is about 17%. As can be seen in the graph 900, the measured results represented by 994 agree well with the theoretical analysis represented by 996. It may be noted that the optical absorption of graphene in THz region differs fundamentally from that in the visible and near infrared frequency regime, where interband optical transition dominates, resulting in only an approximately 2.3% intensity modulation that changes very little with the Fermi level/gate voltage near the Dirac point.

An integrated device including a graphene modulator and a CCG QCL may be referred herein as an integrated graphene modulator. The integrated graphene modulator may be identical to or at least substantially similar to the layer arrangement 100A of FIG. 1A or the layer arrangement 100B of FIG. 1B. The active region of the QCL may be grown by molecular beam epitaxy on an undoped GaAs substrate. The fabrication of the integrated graphene modulator may begin with gold-to-gold thermocompression bonding of the QCL active region to an n+ GaAs receptor wafer. The original QCL substrate can then be removed by a combination of lapping and selective chemical etching. This can be followed by the removal of the highly absorptive contact layer of the active region to prevent high attenuation of the THz wave coupled out through the grating slits. Top metal gratings can be defined by standard optical lithography and lift-off. The metal gratings may include a titanium layer of 15 nm, a gold layer of 300 nm and a titanium layer of 10 nm, in other words, Ti/Au/Ti 15/300/10 nm. The top 10 nm Ti layer can be used as an adhesive layer between the Au and the subsequently deposited $SiO_2$ insulator layer, which can be grown by PECVD. After patterning the $SiO_2$ layer to allow electrical access to the QCL, another optical lithography and lift-off process can be carried out to define the graphene electrode on top of the $SiO_2$/CCG rings. A graphene sheet can then be transferred onto the graphene electrode, followed by an annealing treatment in nitrogen atmosphere at 160° C. for 3 hours. This may cause the PMMA/graphene film to slowly relax and make full contact with the underlying surface. The PMMA layer can be removed by acetone, before the graphene is patterned to remove unwanted graphene area and also to avoid contact with the bias electrodes of the QCL. Samples of the integrated graphene modulator can be cut and indium-mounted onto Cu submounts, wire-bonded, and finally attached to the cold finger of a cryostat for measurements to validate the performance of the integrated graphene modulator.

Figure 10A:
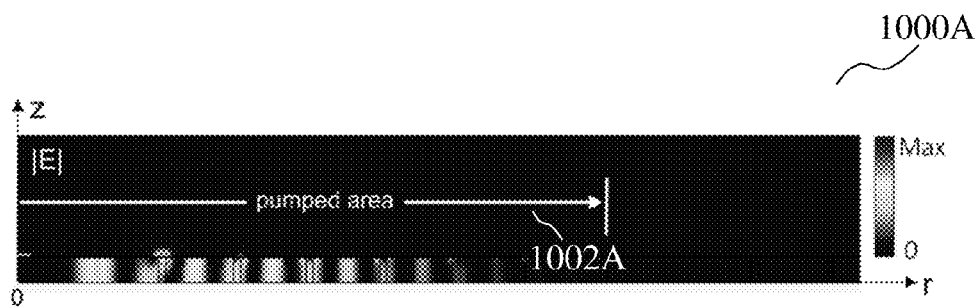
FIG. 10A shows a graph showing a cross-sectional view of a calculated electric field distribution of a CCG QCL.

FIG. 10A shows a graph 1000A which plots the cross-sectional view of the calculated electric field distribution of the CCG QCL. An electrically pumped area 1002A is indicated in the graph 1000A.

Figure 10B:
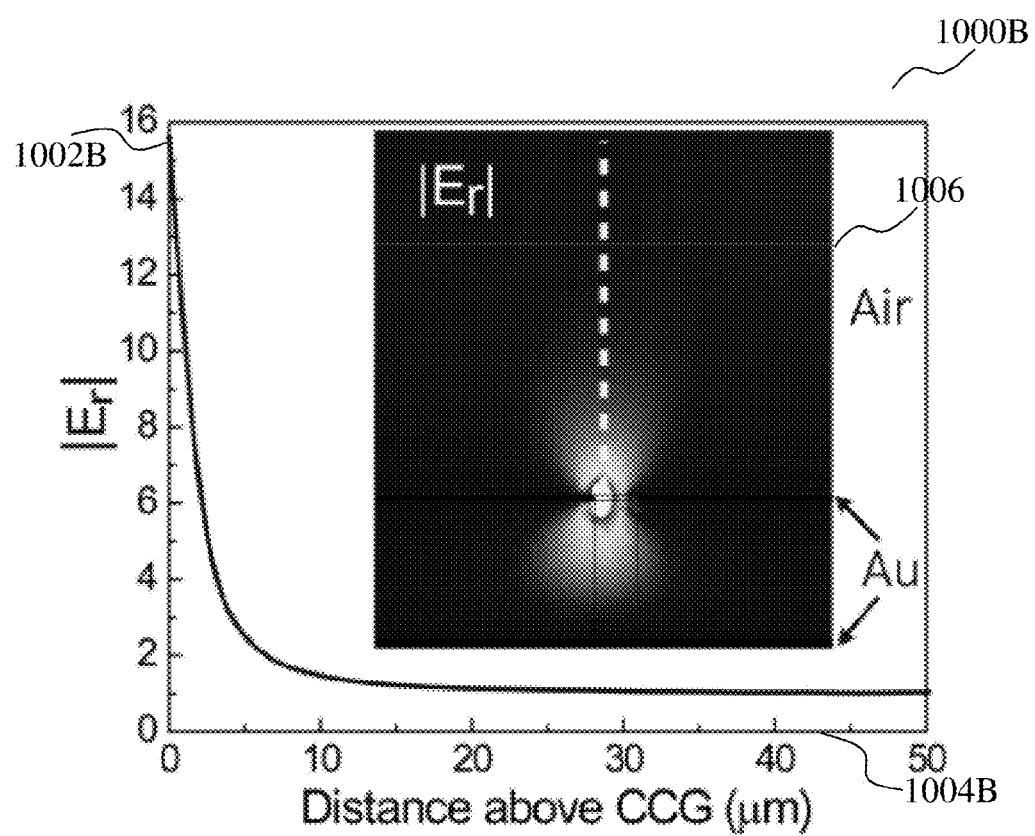
FIG. 10B shows a graph showing an enhancement factor of the electric field in the graphene region near the output aperture of the CCG QCL (along the white dashed line in the inset of the figure) as a function of the distance above the CCG, for an integrated graphene modulator according to various embodiments.

FIG. 10B shows a graph 1000B showing an enhancement factor of the electric field near the output aperture of the CCG QCL as a function of the distance above the CCG (along the white dashed line in the inset), for an integrated graphene modulator according to various embodiments. The integrated graphene modulator is also referred herein as a layer arrangement. The graph 1000B includes a vertical axis 1002B indicating the magnitude of the electric field, herein also referred to as $|E_r|$; and a horizontal axis 1004B indicating a distance above the CCG in μm. FIG. 10B also includes an inset 1006 showing a cross-sectional plot of the $E_r$ distribution around the CCG apertures. As only the horizontally-polarized component of the electric field $E_r$ is responsible for the THz emission into far field, the $E_r$ distribution around the CCG apertures was investigated with a representative cross-sectional plot shown in the inset 1006. The curve in the graph 1000B describes the $|E_r|$ field profile along the white dashed line of the inset 1006, indicating a great enhancement of $|E_r|$ in the aperture region. The electric field is averagely enhanced by a factor of about 12 in the graphene region for a spacing thickness of 450 nm by $SiO_2$. A large modulation strength is expected when the graphene is integrated with a THz CCG QCL owing to this large electric field enhancement.

Figure 11:
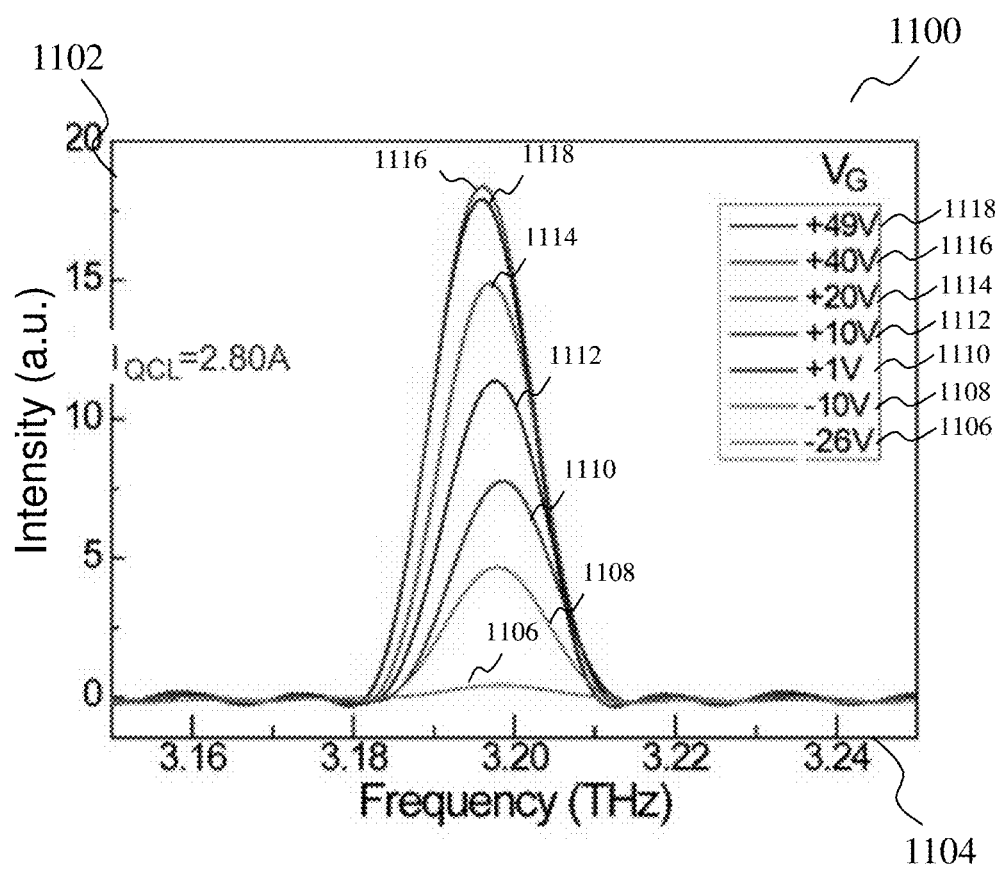
FIG. 11 shows a graph showing enhanced modulation of the THz wave by an integrated graphene modulator according to various embodiments. The intensity of the lasing peak varies from nearly zero at $V_G=-26$ V to a maximum at $V_G=+40$ V.

FIG. 11 shows a graph 1100 showing enhanced modulation of the THz wave by an integrated graphene modulator according to various embodiments. The graph 1100 was plotted using measurements obtained while the QCL was biased at 14.8 V, corresponding to an injected current of 2.82 A, in pulse mode at 500 ns pulses with 10 kHz repetition rate and at 20 K heat sink temperature, while the graphene was gated at various direct current voltages. The graphene voltage $V_G$ is defined by the difference between $V_{QCL}$ and $V_{gr}$, with $V_{QCL}$ being the voltage applied to the QCL electrode and $V_{gr}$ being the voltage applied to the gating electrode. In other words, $V_{gr}$ is the tuning voltage applied to the gating electrode layer 104 of FIGS. 1A and 1B. The enhanced modulating effect of graphene on the CCG QCL is shown in the graph 1100. The graph 1100 includes a vertical axis 1102 indicating intensity in arbitrary units (a.u.) and a horizontal axis 1104 indicating frequency in THz. The graph 1100 further includes a first plot 1106 representing intensity versus frequency at gate voltage of −26V; a second plot 1108 representing intensity versus frequency at gate voltage of −10V; a third plot 1110 representing intensity versus frequency at gate voltage of +1V; a fourth plot 1112 representing intensity versus frequency at gate voltage of +10V; a fifth plot 1114 representing intensity versus frequency at gate voltage of +20V; a sixth plot 1116 representing intensity versus frequency at gate voltage of +40V; and a seventh plot 1118 representing intensity versus frequency at gate voltage of +49V. The plots 1106 to 1118 show that the intensity of the lasing peak varies from nearly zero at $V_G=-26$ V to a maximum at $V_G=+40V$. It may be noted that although the graphene may be arranged above the cavity, it may interact with the evanescent waves of the cavity mode through the output apertures. Therefore, when gating the graphene at different voltages, its refractive index may vary, leading to a slight change of the effective refractive index of the laser cavity, and, thus, a slight shift of the lasing peak, as can be seen in the graph 1100.

In conventional QCLs, fast direct modulation of the laser itself may be achieved by microwave injection, for example more than 10 GHz for ridge-waveguide devices. However, as the pumped current and voltage keeps changing, the gain profile and the refractive index, as well as the temperature, of the active region of the QCL may vary rapidly, resulting in a fluctuating laser frequency, also known as the frequency chirping effect. In comparison, an in integrated graphene modulator, also referred herein as a layer arrangement, according to various embodiments, may allow stable operation of a laser device. The integrated graphene modulator may perform modulation of the laser by changing the graphene voltage, instead of directly modulating the laser. As shown in FIG. 11, while the integrated graphene modulator may not entirely remove the chirping effect, it may at least achieve a substantially smaller chirping effect. The effective refractive index change induced by the gating graphene may be much smaller than that induced by the modulating gain medium as in conventional QCLs. Therefore, the layer arrangement may be advantageous in applications where the chirping effect is not desired. In addition, the integrated graphene modulator may also be used as a whole as a THz modulator for free space light modulation with the active region of the QCL unpumped or pumped below the threshold, so that it is suitable for many other applications which have their own light sources.

Figure 12:
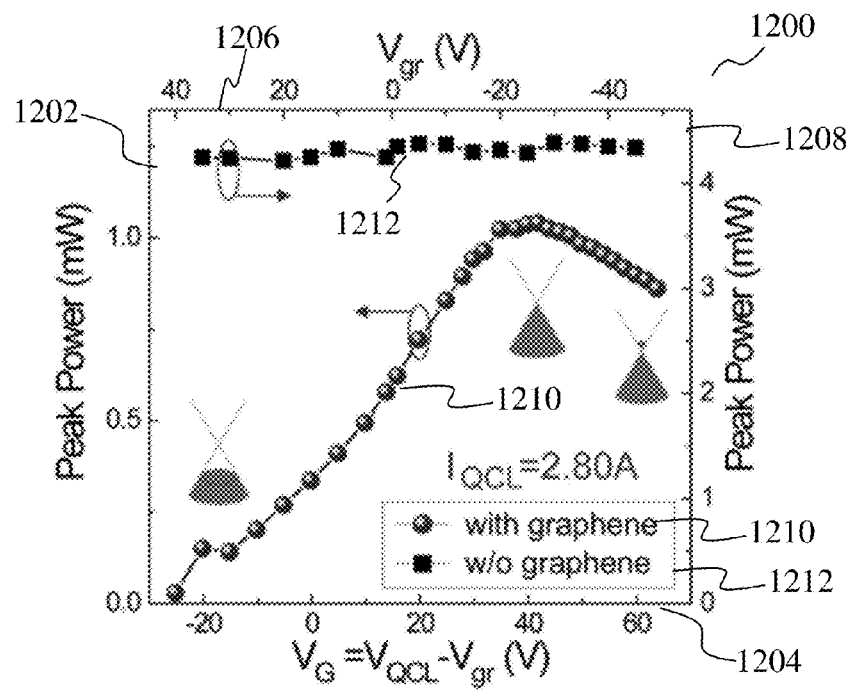
FIG. 12 shows a graph showing the dependence of an output power of the CCG QCL on $V_G$ for an integrated graphene modulator according to various embodiments.

FIG. 12 shows a graph 1200 showing the dependence of an output power of the CCG QCL on $V_G$ for an integrated graphene modulator according to various embodiments. The graph 1200 includes a first vertical axis 1202 indicating peak power in miliwatts; a second vertical axis 1208 indicating peak power in miliwatts; a first horizontal axis 1204 indicating $V_G$ in volts; and a second horizontal axis 1206 indicating $V_{gr}$ in volts. The graph 1200 includes a first plot 1210 indicated by solid circles and a second plot 1212 indicated by squares. The first plot 1210 (to be read with the first vertical axis 1202) shows that the average laser output of the integrated graphene modulator increases with increasing $V_G$, which is consistent with the results in FIGS. 8 and 9. As a comparison, a control device without the graphene sheet can be fabricated. The second plot 1212 (to be read with the second vertical axis 1208) shows the output power of the control device, plotted as a function of $V_G$. The second plot 1212 shows that there is no obvious modulation observed in the output power of the control device. It may be noted that with the presence of the graphene, the output power may decrease significantly. For example, the power of the integrated graphene modulator at $V_G$=+40 V is around a quarter of that from the control device.

Figure 13:
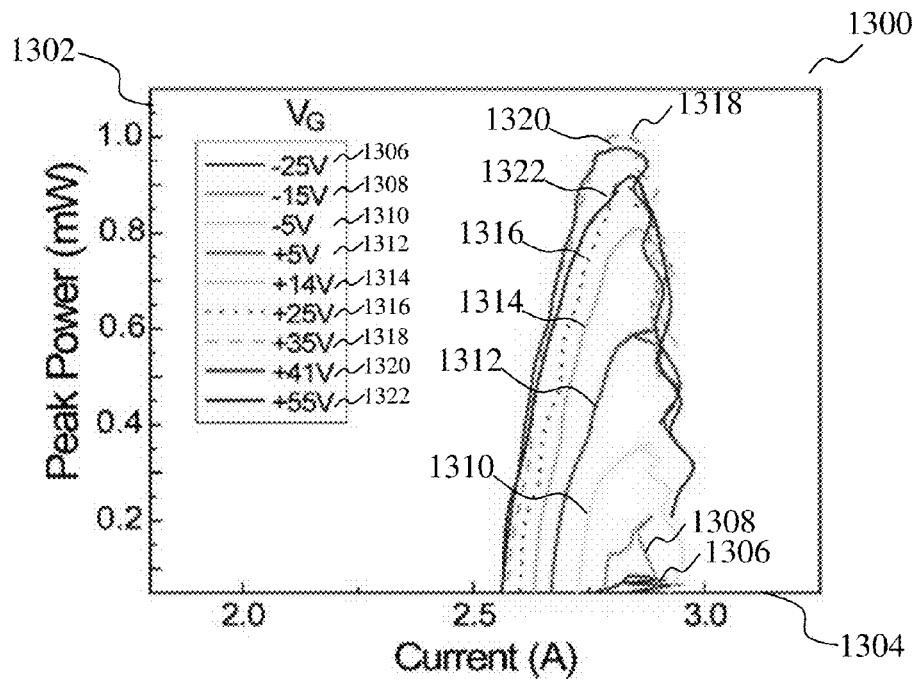
FIG. 13 shows a graph showing light-current characteristics of the QCL with various $V_G$ levels, for an integrated graphene modulator according to various embodiments.

FIG. 13 shows a graph 1300 showing light-current characteristics of the QCL with various $V_G$ levels, for an integrated graphene modulator according to various embodiments. The light-current curves of the laser at a series of graphene gate voltages can be measured to further verify the effect of the graphene modulator. The graph 1300 includes a vertical axis 1302 indicating peak power in miliwatts and a horizontal axis 1304 indicating current in amperes. The graph 1300 further includes a first plot 1306 at $V_G$=−25V; a second plot 1308 at $V_G$=−15V; a third plot 1310 at $V_G$=−5V; a fourth plot 1312 at $V_G$=+5V; a fifth plot 1314 at $V_G$=+14V; a sixth plot 1316 at $V_G$=+25V; a seventh plot 1318 at $V_G$=+35V; an eighth plot 1320 at $V_G$=+41V and a ninth plot 1322 at $V_G$=+55V. As shown in the respective peak values of each plot of the first plot 1306 to the ninth plot 1322, the integrated graphene modulator is capable of varying the peak power from almost zero mW to about 1 mW through the variation of the graphene voltage $V_G$ from −25V to +55V. Therefore, the graph 1300 confirms that the integrated graphene modulator is able to achieve a 100% modulation depth, in other words $|\Delta T|/T_{Max}$ of the THz wave, for the THz QCL pumping current value of below 2.78 A. $\Delta T$ may indicate a change in transmission while $T_{Max}$ may indicate a maximum transmission. The emission may vanish when the graphene is biased with a large enough negative voltage. For higher pumping current of the THz QCL, for example in the range of 2.78 A to 2.93 A, the THz may not be totally suppressed, although a modulation depth of 94% may still be obtainable in the worst case when the injection current to the QCL is about 2.85 A.

Figure 14A:
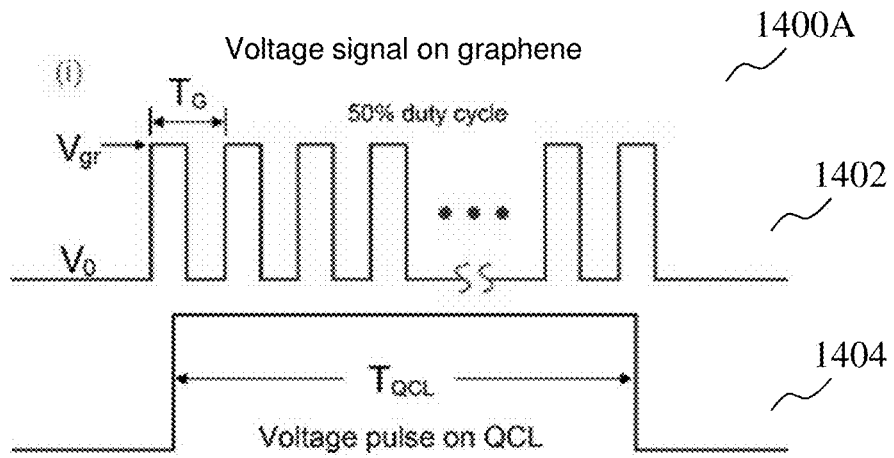
FIG. 14A shows a graph showing voltage signals against time applied onto the integrated graphene modulator and the QCL according to various embodiments.
Figure 14B:
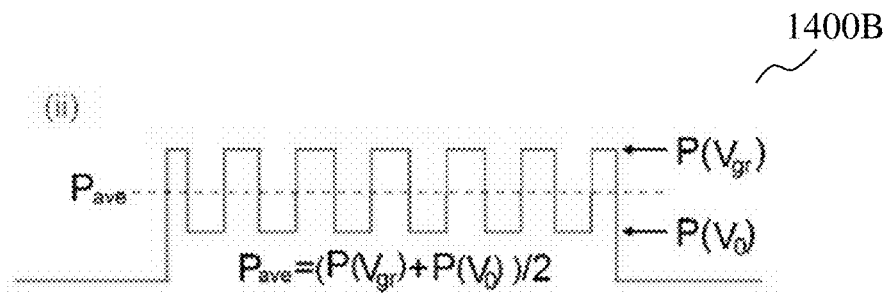
FIG. 14B shows a graph showing the predicted power output of the integrated graphene modulator plotted against time when the integrated graphene modulator is able to follow the variation of the applied voltage shown in FIG. 14A.
Figure 14C:
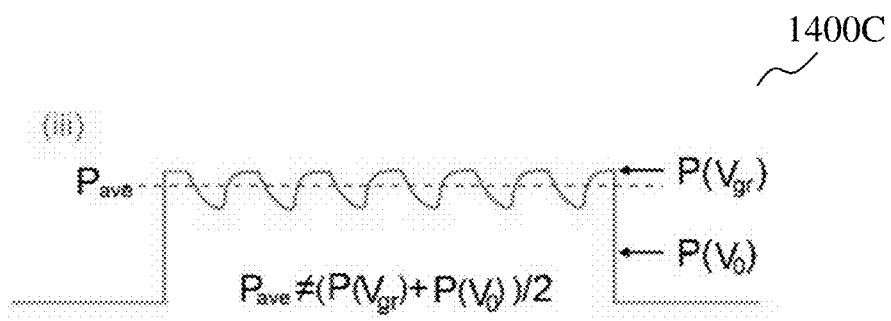
FIG. 14C shows a graph showing the predicted power output of the integrated device plotted against time if the applied voltage shown in FIG. 14A is faster than the speed of the graphene modulator.

FIGS. 14A-14C show a bias scheme of an integrated graphene modulator according to various embodiments, and the measurements of the modulation speed of the integrated graphene modulator. Due to the lack of commonly available fast THz detector, the time-varying THz modulated signal may not be directly observable to determine the operational speed of the modulator. The modulation speed may be estimated instead, by monitoring the average output power of the integrated graphene modulator while an alternating current (AC) voltage signal is applied to the gating electrode.

FIG. 14A shows a graph 1400A showing voltage signals against time. The graph 1400A includes a first voltage signal 1402 and a second voltage signal 1404. The first voltage signal 1402 is the voltage signal applied to the graphene layer of the integrated graphene modulator. The second voltage signal 1404 is the voltage signal applied to the laser layer of the integrated graphene modulator. The laser layer may be a QCL. The bias scheme of the integrated graphene modulator can be such that the pulse duration for the QCL is fixed at $T_{QCL}$=1 μs. In other words, the frequency of the QCL, $f_{QCL}$ can be 1 MHz. The first voltage signal 1402 can be an AC rectangular signal which is applied to the gating electrode of the integrated graphene modulator. The AC rectangular signal can be a 50% duty cycle. The period of the rectangular signal can be $T_G$=$T_{QCL}$/N, in other words $f_G$=$Nf_{QCL}$, where N is an integer.

FIG. 14B shows a graph 1400B showing a predicted power output of the integrated graphene modulator plotted against time, in relation to the voltage signals shown in graph 1400A. In other words, the graph 1400B shows the predicted output optical signal of the integrated graphene modulator if the integrated graphene modulator can follow the variation of the applied voltage of FIG. 14A. In this case, the average peak power $P_{ave}$=$(P(V_{gr})+P(V_0))/2$ regardless of the modulation frequency. $P(V_{gr})$ and $P(V_0)$ are the output peak powers when a constant $V_{gr}$ or $V_0$ is applied to the gating electrode, respectively.

FIG. 14C shows a graph 1400C showing the predicted output optical signal of the integrated graphene modulator plotted against time, when the applied voltage signal on the graphene layer is much faster than the response speed of the integrated graphene modulator. In this case, $P_{ave}$ can deviate far away from $(P(V_{gr})+P(V_0))/2$. Therefore, a $P_{ave}$ versus $f_G$ curve may be flat until up to a cut-off point, where the corresponding $f_G$ is approximately the modulation speed of the integrated graphene modulator. In other words, the $P_{ave}$ can be at least substantially constant against variations in frequency of the voltage applied to the graphene layer, until the frequency of the voltage applied to the graphene layer is at least substantially equal to the modulation speed of the integrated graphene modulator.

Figure 15:
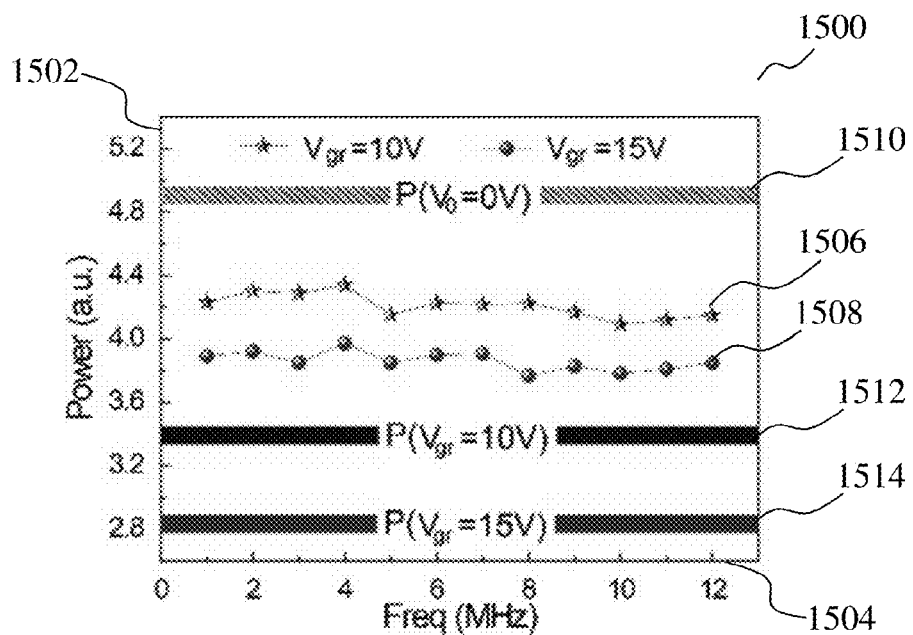
FIG. 15 shows a graph showing an average peak power output as a function of modulation frequency.

FIG. 15 shows a graph 1500 showing $P_{ave}$ as a function of modulation frequency. The graph 1500 includes a vertical axis 1502 indicating power in arbitrary units and a horizontal axis 1504 indicating modulation frequency in MHz. The graph 1500 includes a first plot 1506 corresponding $V_0$=0V and $V_{gr}$=10V. The graph 1500 further includes a second plot 1508 corresponding to $V_0$=0V and $V_{gr}$=15V. The graph 1500 further includes a first ribbon 1510 indicating the output power when the graphene electrode is DC biased at 0V; a second ribbon 1512 indicating the output power when the graphene electrode is DC biased at 10V; and a third ribbon 1514 indicating the output power when the graphene electrode is DC biased at 15V. The widths of the ribbons 1510, 1512 and 1514 indicate the instability of the laser power during the measurement period. As expected, a flat dependency in the relatively low frequency region was observed. However, a cut-off point up to 12 MHz was not observed due to a frequency limitation by the experimental facilities. The graph 1500 shows that the integrated graphene modulator can at least operate at 12 MHz, which already makes it one of the fastest THz modulators.

Figure 16:
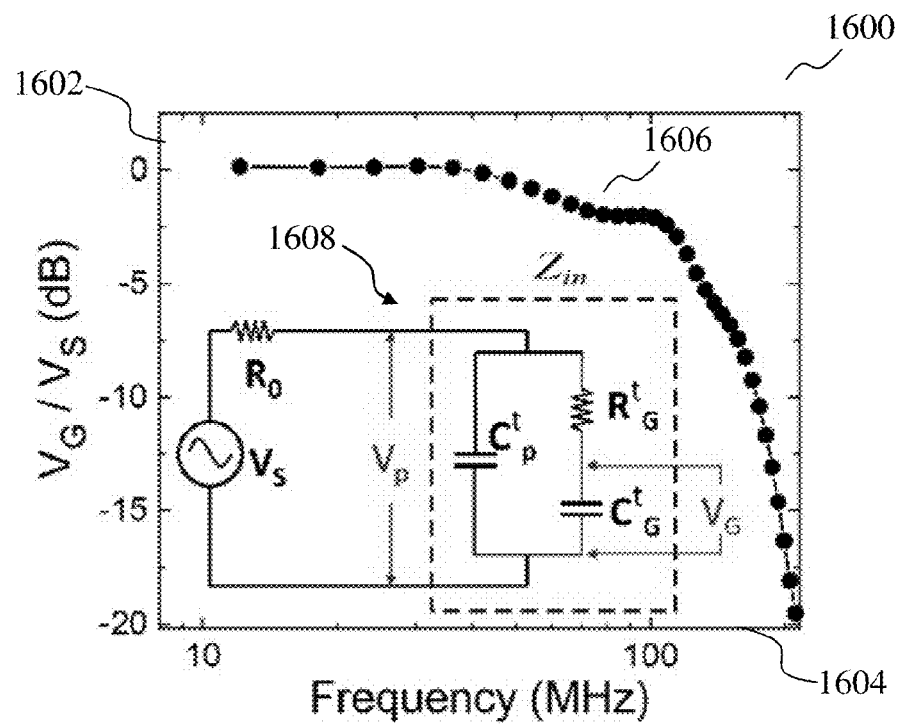
FIG. 16 shows a graph showing a frequency response of an integrated graphene modulator according to various embodiments.

FIG. 16 shows a graph 1600 showing a frequency response of the integrated graphene modulator. FIG. 16 also shows an equivalent circuit model 1608 of the integrated graphene modulator. The graph 1600 includes a vertical axis 1602 indicating a ratio of $V_G$ to $V_S$ in terms of decibels; and a horizontal axis 1604 indicating frequency in terms of MHz. The graph 1600 further includes a line 1606 showing the frequency response of the integrated graphene modulator. The line 1606 can be a plot of dynamic response (S21) measurements of the integrated graphene modulator. The S21 measurements can be obtained using a radio frequency (RF) network analyzer and an equivalent circuit model, as well as the information from graph 1500 of FIG. 15. The line 1606 shows that at the 3-dB cutoff point, the frequency is about 110 MHz. Therefore, the modulation speed can be estimated to be 110 MHz.

The electrical modulation on the graphene sheet can be expressed by Equation (1):

$$\frac{V_G}{V_S} = \frac{1}{1 + i\omega R_0 C_p^t + R_0/(R_G^t + 1/i\omega C_G^t)} \times \frac{1}{1 + i\omega R_G^t C_G^t} \approx$$

$$\frac{1}{1 + i\omega R_0 (C_p^t + C_G^t)} \times \frac{1}{1 + i\omega R_G^t C_G^t}$$

(1)

where $V_S$ and $V_G$ are the amplitude of the voltage on the gating electrode and the actual amplitude of the voltage applied on the graphene sheet, respectively; $R_0$ is the internal impedance of the radiofrequency (RF) source, assumed to be 50Ω; $R_G^t$ represents the effective graphene resistance; $C_G^t$ is the total capacitance of the graphene sheet; $C_p^t$ is the total capacitance of the metal contacts; and ω is the angular frequency of the modulation.

In Equation 1, it is assumed that $R_G^t \ll 1/i\omega C_G^t$. As can be seen from Equation (1), the cut-off frequency can be dependent on a first time constant $\tau_1 = R_0(C_p^t + C_G^t)$ and a second time constant $\tau_2 = R_G^t C_G^t$. The first time constant can be decreased by reducing the size of the graphene back gate, in other words, the QCL bias contact electrode, which requires a smaller cavity design. The second time constant can be decreased by reducing the width of the slits of the gating electrode which can make the effective area of the graphene sheet smaller so that the graphene capacitance is smaller. The second time constant can also be decreased by reducing the graphene resistance which is dominated by the contact resistance at the metal/graphene edges.

An integrated graphene modulator, according to various embodiments may include a graphene modulator monolithically integrated with a surface-emitting CCG QCL which emits electromagnetic waves having a frequency in the range of THz. The integrated graphene modulator may achieve a 94% to 100% modulation depth and fast response speed of 110 MHz. The high modulation depth may be achieved as a consequence of a strong interaction of the graphene with the laser field. The laser field may be further enhanced at the output apertures of CCG which function as the laser cavity. The fast response speed may be a result of the reduced device area enabled by the integration. The integrated graphene modulator may also be applied to electromagnetic waves in the mid-infrared or near-infrared frequency ranges as the graphene modulator is inherently capable of broadband optical absorption.

The CCG used in the individual characterization of the CCG QCL may have a grating structure starting from the center to the boundary as follows:
59.8/3/27.4/3/26.3/3/26.6/3/26.5/3/26.4/3/27.4/3/27.4/3/
27.4/3/27.4/3/27.4/3/27.4/3/27.9/3/2 7.9/3/27.9/3/27.9/3/
150
in μm, where the bold numbers indicate the slit region, and the underlined parts are connected by spoke bridges to allow electrically pumping their underneath active region.

Figure 17:
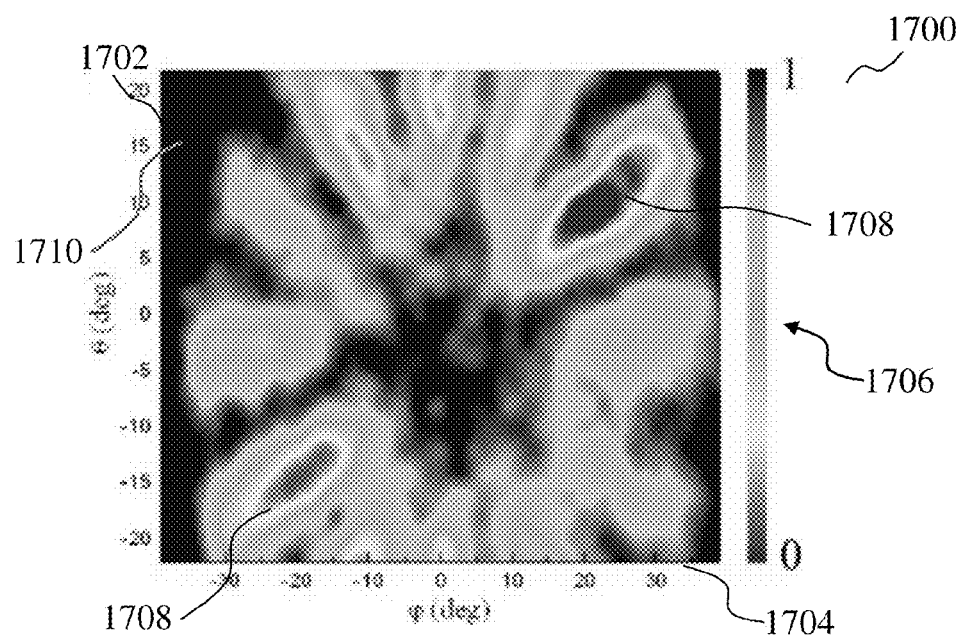
FIG. 17 shows a graph showing a measured two-dimensional far-field emission pattern of a surface-emitting CCG QCL according to various embodiments.

FIG. 17 shows a graph 1700 showing a measured two-dimensional far-field emission pattern of the surface-emitting CCG QCL. The graph 1700 includes a vertical axis 1702 indicating a vertical angular distance from the normal to the CCG QCL while the horizontal axis 1704 indicates a horizontal angular distance from the normal to the CCG QCL. In other words, the vertical axis 1702 and the horizontal axis 1704 indicate the rotation angle of the detector with respect to the normal of the QCL surface. The graph 1700 shows the far-field intensity distribution of the laser, where the electric field value is indicated by a color indicated on the color map 1706. As the graph 1700 is reproduced herein in monochrome, the minimal value and peak values are manually indicated. The peak values occur in the regions marked 1708; while the minimal values occur in the surrounding region marked 1710. The two-dimensional far-field emission pattern of the CCG QCL may be measured by scanning a pyroelectric detector on a spherical surface centered at the laser, where the (0, 0) position represents the normal to the laser surface. The optical mode in the laser cavity can be identified from the measured far-field pattern.

Figure 18:
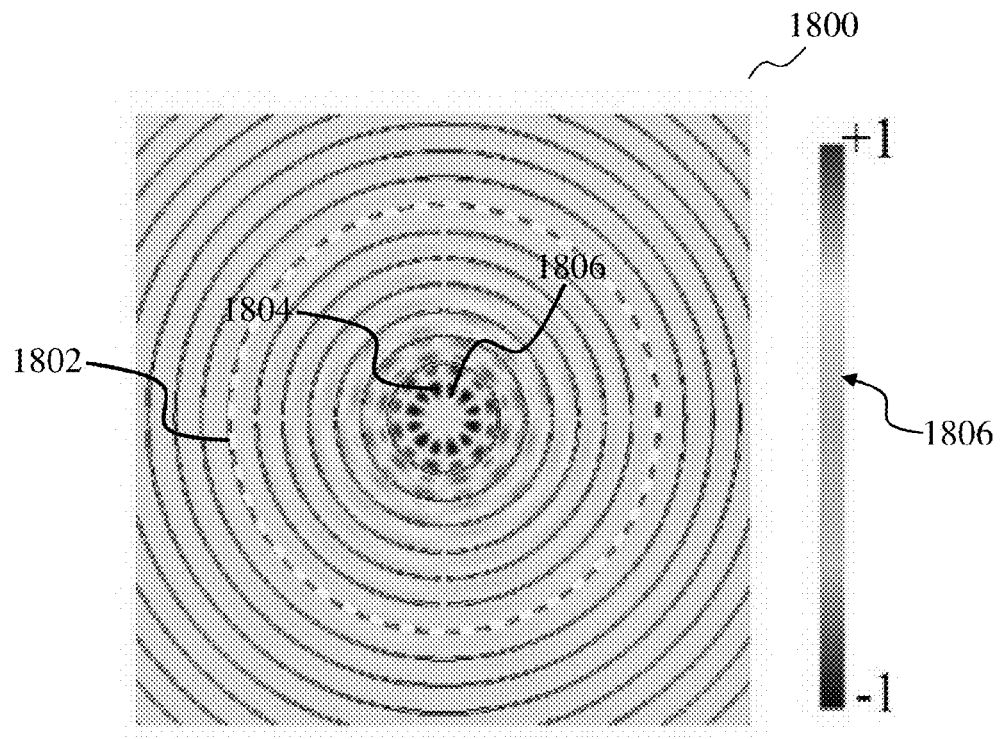
FIG. 18 shows a graph showing a top view of the calculated optical mode in the surfacing-emitting CCG QCL corresponding to the far-field emission pattern in FIG. 17.

FIG. 18 shows a graph 1800 showing a top view of the calculated optical mode inside the CCG QCL. The electric field is confined in the pumping area 1802 of the CCG QCL. The pumping area 1802 is shown in the graph 1800 as enclosed by a white dash circle. It may be noted that the actual pumped area can be larger than that enclosed by the white dash circle considering the lateral current spreading in the active region, which may be around 20 μm. The centre most portion of the CCQ QCL has the maximum value 1806 and the minimum value 1804 of electric field values.

Figure 19:
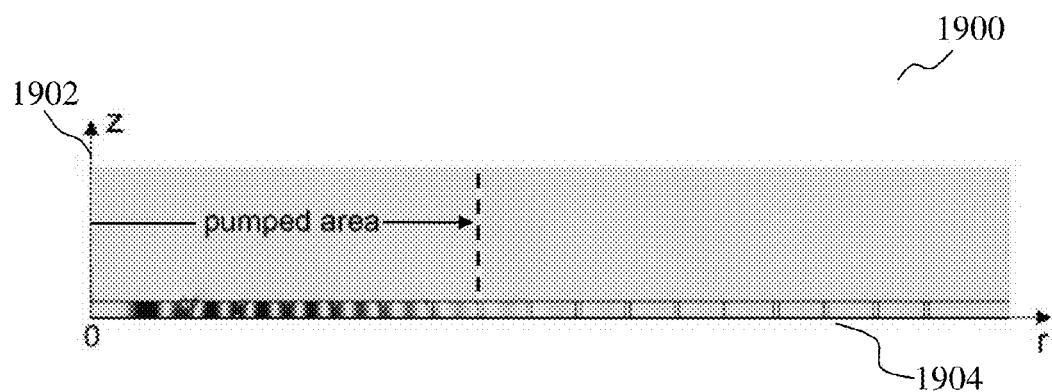
FIG. 19 shows a graph showing the cross-sectional view of the optical mode in the CCG QCL.

FIG. 19 shows a graph 1900 showing the cross-sectional view of the optical mode in the laser cavity. The graph 1900 includes a vertical axis 1902 indicating a vertical distance from the centre of the CCG QCL while the horizontal axis 1904 indicates a horizontal distance from the centre of the CCG QCL. The dashed line indicates a boundary of the electrically pumped area. According to the optical mode, the CCG QCL operates at the sixth-order azimuthal mode although the design was targeted on the first-order mode. This deviation is mainly due to the underestimation of the gain peak frequency of the active region.

Figure 20:
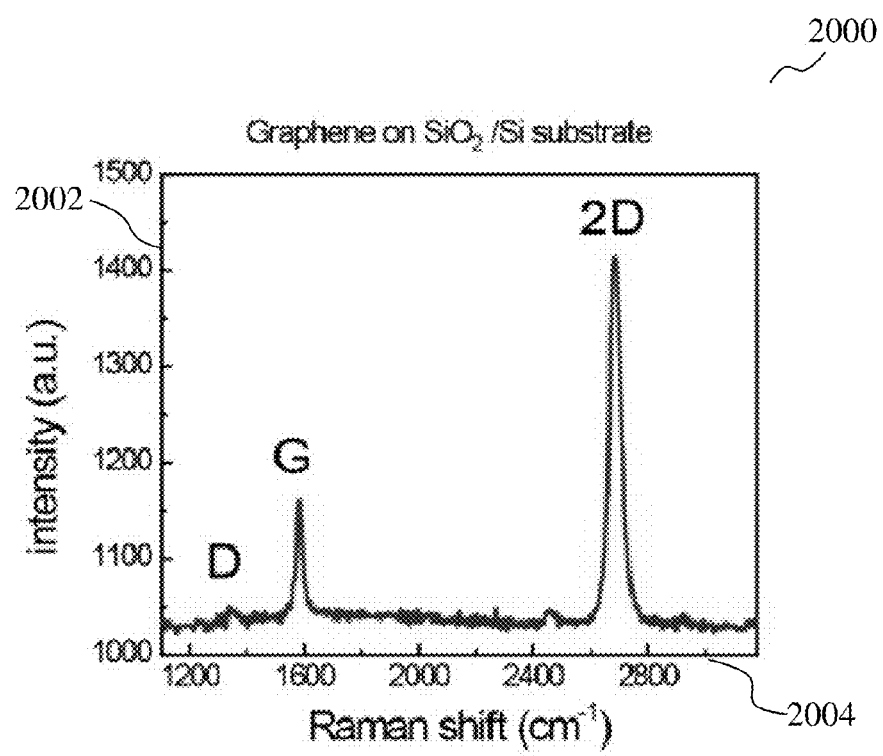
FIG. 20 shows a graph showing the Raman spectrum of the standalone graphene modulator used for the individual characterization of the graphene layer according to various embodiments.

FIG. 20 shows a graph 2000 showing the Raman spectrum of the standalone graphene modulator used for the individual characterization of the graphene layer. The graphene used for obtaining the Raman spectrum is the transferred graphene on the $SiO_2$/Si substrate. The graph 2000 includes a vertical axis 2002 indicating intensity in arbitrary units; and a horizontal axis 2004 indicating Raman shift in $cm^{-1}$.

Figure 21:
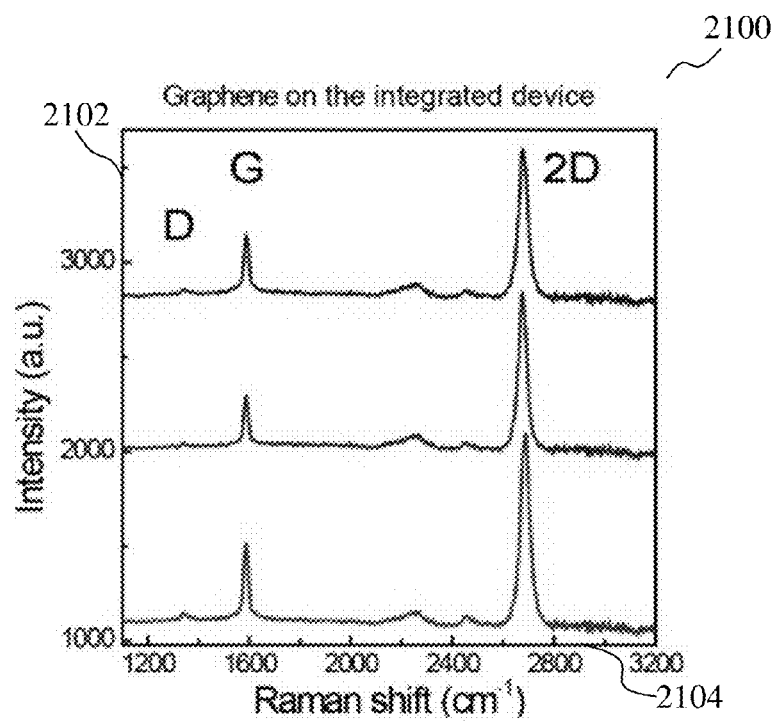
FIG. 21 shows a graph showing the Raman spectrum of the graphene layer of the integrated graphene modulator according to various embodiments.

FIG. 21 shows a graph 2100 showing the Raman spectrum of the graphene layer of the integrated graphene modulator. The Raman spectrum is obtained for the transferred graphene in different slits (also referred herein as apertures) of the concentric-circular grating of the integrated graphene modulator. The graph 2100 includes a vertical axis 2102 indicating intensity in arbitrary units; and a horizontal axis 2104 indicating Raman shift in $cm^{-1}$. Compared with the graph 2000 of FIG. 20, the graph 2100 has a few additional small peaks around 2250 $cm^{-1}$, which may be a result of the chemical residue in the slits. Overall, the near absent D peak, the single-Lorentzian-shape 2D peak and the 2D/G intensity ratio of about 3 of each spectrum confirm the high quality of the graphene after transfer.

The model used to retrieve the graphene parameters are described in the following paragraphs. The carrier density in the graphene can be approximately expressed by Equation (2):

$$n_{tot} = \sqrt{n_0^2 + n(V_g)^2}$$

(2)

where $n_0$ represents the residual carrier concentration at the Dirac point, which is non-zero owing to charged impurities in the dielectric or the graphene/dielectric interface; and $n(V_g)$ represents the carrier concentration induced by the electric gating, and can be obtained from a simple parallel capacitor model, expressed in Equation (3):

$$V_g - V_{CNP} = \frac{e}{c_{ox}}n + \frac{E_f}{e} \approx \frac{e}{c_{ox}}n \quad (3)$$

where $c_{ox} = \in_0 \in_{ox}/t$, with $\in_0$ being the permittivity of free space and $\in_{ox}$ the dielectric constant of $SiO_2$ (~3.9), is the geometrical capacitance. For oxide thickness of t=450 nm, $c_{ox} = 8 \times 10^{-9}$ F/cm². $V_{CNP}$ is the applied voltage corresponding to the Dirac point.

The square resistance across the source and drain can be expressed in Equation (4)

$$R_{tot} = R_{contact} + \frac{1}{en_{tot}u} \quad (4)$$

where $R_{contact}$ represents the metal/graphene contact resistance.

Figure 22:
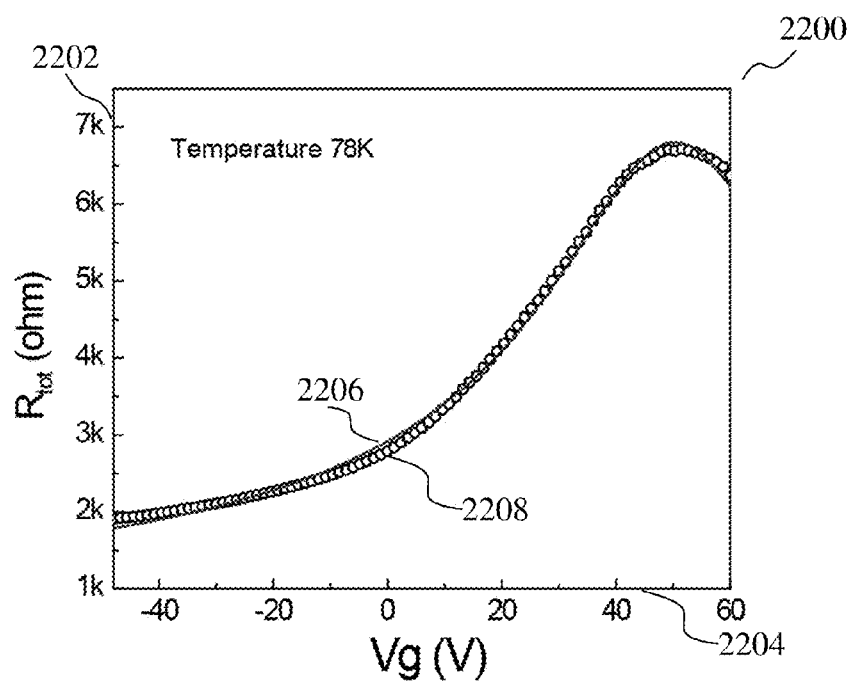
FIG. 22 shows a graph showing the square resistance of the CVD graphene transistor as a function of the gate voltage.

FIG. 22 shows a graph 2200 showing the square resistance of the CVD graphene transistor as a function of the gate voltage. The CVD graphene transistor can be the standalone graphene modulator used for the individual characterization of graphene. The graph 2200 includes a vertical axis 2202 indicating total resistance in ohms; and a horizontal axis 2204 indicating $V_G$ in volts. The model described above, in other words, the theoretical fit, is shown as a curved line 2206. The measured data is shown as a series of plots 2208. By fitting the measured data with the model, the relevant parameters were extracted as follows:

$n_0 = 1.0 \times 10^{12}/cm^2$, $u=924$ $cm^2V^{-1}s^{-1}$, $V_{CNP}=50.2V$ and $R_{contact}=440\Omega$.

The graphene sheet conductivity may be given by $1/(R_{tot}$ (measured)$-440\Omega$). The Fermi level can be calculated by $E_f = \hbar v_f \sqrt{\pi n_{tot}}$, where $v_f \approx 1 \times 10^6$ ms$^{-1}$ is the Fermi velocity.

Figure 23:
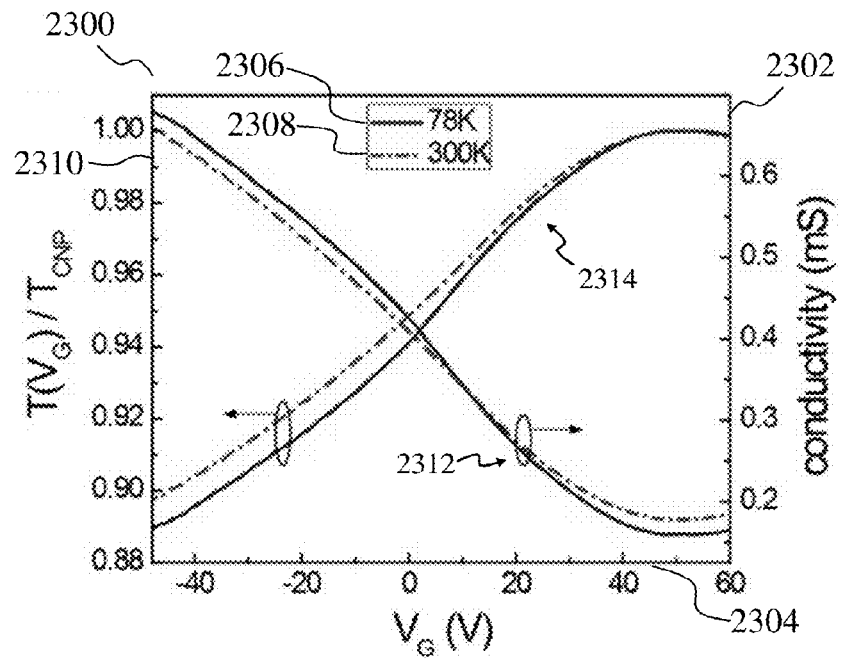
FIG. 23 shows a graph showing the calculated transmittance normalized to the value at the Dirac point and the electrical transport measurements of the graphene sheet at 78 K and 300 K.

FIG. 23 shows a graph 2300 showing a change in conductivity of the graphene in response to the gate voltage $V_G$. The electrical transport property and the optical modulation of the same graphene sheet can be measured at 78 K and 300 K temperature, to investigate the graphene response at cryogenic and room temperature. The graph 2300 includes a first vertical axis 2302 indicating conductivity in mS; and a horizontal axis 2304 indicating the gate voltage $V_G$ in volts. The graph 2300 also includes a set of plots 2312. The graphene response can be measured and plotted for a first temperature of 78K and a second temperature of 300K. The graphene response at 78K is shown as a solid line 2306 while the graphene response at 300K is shown as a dashed line 2308. The set of plots 2312 shows that the graphene undergoes a larger change of conductivity across the gate voltage range at 78K, than at 300K. Treating graphene as a zero thickness conductive layer with free carriers and current, and deriving from Maxwell equations, the transmission intensity at the air/graphene/dielectric interface can be expressed as Equation (5):

$$\frac{T(\omega, V_G)}{T(\omega, V_{CNP})} = \left( \frac{1 + n_{diel} + Z_0 \sigma_0(\omega)}{1 + n_{diel} + Z_0 \sigma(\omega, V_G)} \right)^2 \quad (5)$$

where $n_{diel}$ is the refractive index of the dielectric; $Z_0 = 376.73\Omega$ is the vacuum impedance; $\sigma_0(\omega)$ is the graphene optical conductivity at the Dirac point; and $\sigma(\omega, V_G)$ is the graphene optical conductivity at the gate voltage $V_G$. The optical conductivity $\sigma(\omega, V_G)$ is related to the DC conductivity $\sigma(V_G)$ measured electrically as $\sigma(\omega, V_G) = \sigma(V_G)/(1+\omega^2\tau^2)$ with $\tau$ being the carrier momentum scattering time (~15 fs). The graph 2300 also includes a further vertical axis 2310 indicating a ratio of the transmission coefficient at gate voltage $T(V_G)$ to the transmission coefficient at charge neutrality point $T_{CNP}$; and a further set of plots 2314 indicating the relationship between $T(V_G)/T_{CNP}$ and the gate voltage $V_G$.

Figure 24:
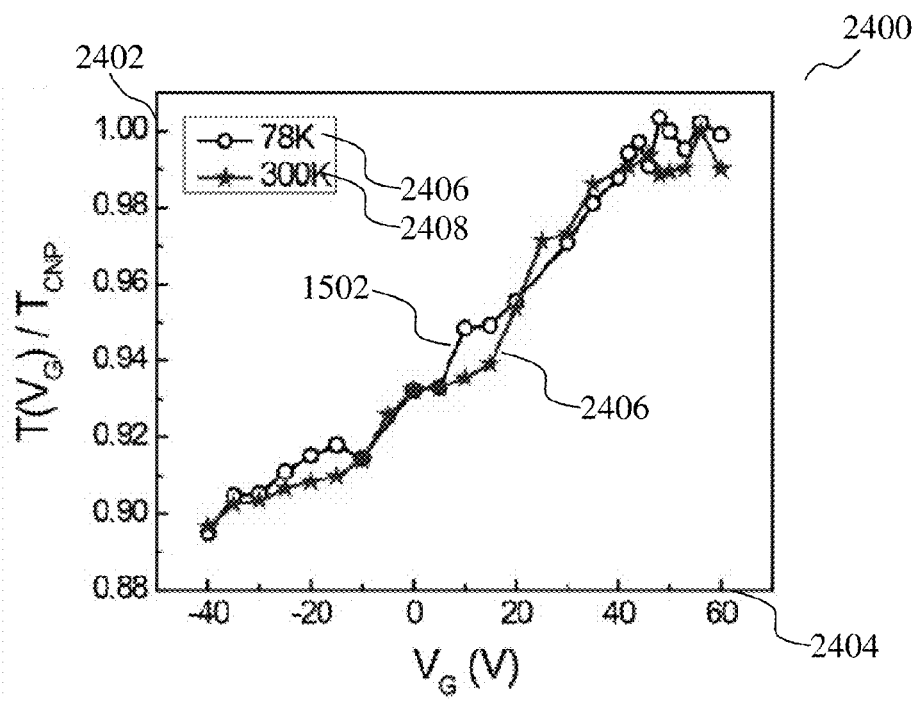
FIG. 24 shows a graph showing the modulation depth in response to gate voltage, for two different temperatures.

FIG. 24 shows a graph 2400 showing the modulation depth in response to gate voltage, for two different temperatures, with the effect of Si substrate removed. The graph 2400 includes a vertical axis 2402 indicating a ratio of the transmission coefficient at gate voltage $T(V_G)$ to the transmission coefficient at charge neutrality point $T_{CNP}$; and a horizontal axis 2404 indicating the gate voltage $V_G$ in volts. The graph 2400 includes a first plot 2406 showing the calculated $T(V_g)/T_{CNP}$–$V_G$ curve of the THz wave (~3.2 THz) at the air/graphene/$SiO_2$ interface at a temperature of 78K; and a second plot 2408 showing the calculated $T(V_g)/T_{CNP}$–$V_G$ curve of the THz wave (~3.2 THz) at the air/graphene/$SiO_2$ interface at a temperature of 300K. The graph 2400 shows that the modulation depth at 78K may be slightly higher by about 1%, than the modulation depth at 300 K. However, the uncertainty in the THz modulation measurement may be larger than this small difference. The modulation depth may be higher at about 17% before the substrate effect is removed.

An equivalent circuit model of the integrated graphene modulator can be built to investigate the high speed performance of the integrated graphene modulator. The derivation of the equivalent high frequency circuit model will be described in the following paragraphs.

Figure 25:
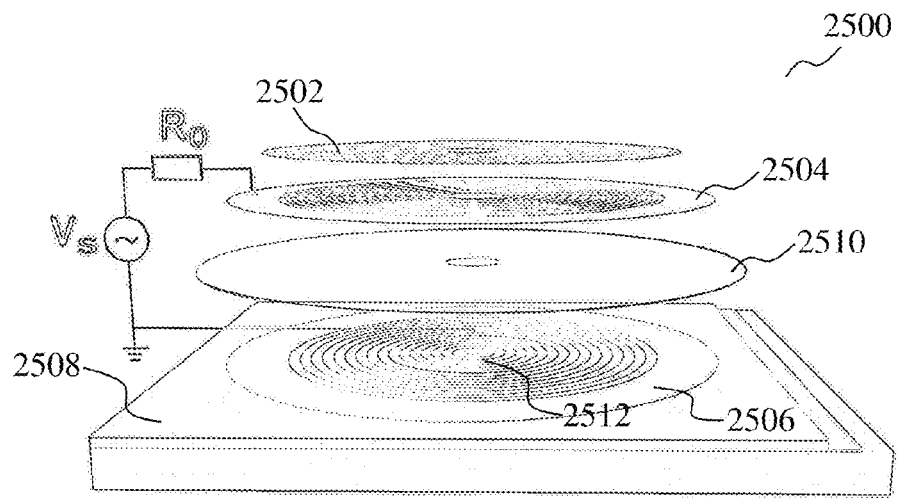
FIG. 25 shows a schematic diagram of the modulation scheme of an integrated graphene modulator according to various embodiments.

FIG. 25 shows a schematic diagram of an integrated graphene modulator 2500 according to various embodiments. The integrated graphene modulator 2500 may include a graphene layer 2502, a gating electrode layer 2504, a CCG layer 2506, an insulator layer 2510, a laser layer 2508 and a bias electrode layer 2512. The bias electrode layer 2512 may be formed within the CCG layer 2506. The bias electrode layer 2512 may include the innermost rings on the CCG layer 2506 connected by spoke bridges. The modulation scheme may be considered to be a function generator with output internal impedance $R_0=50\Omega$ applied between the bias electrode layer 2512 and the gating electrode layer 2504. The bias electrode layer 2512 and the gating electrode layer 2504 may be insulated by the insulator layer 2510 which may include $SiO_2$.

Figure 26:
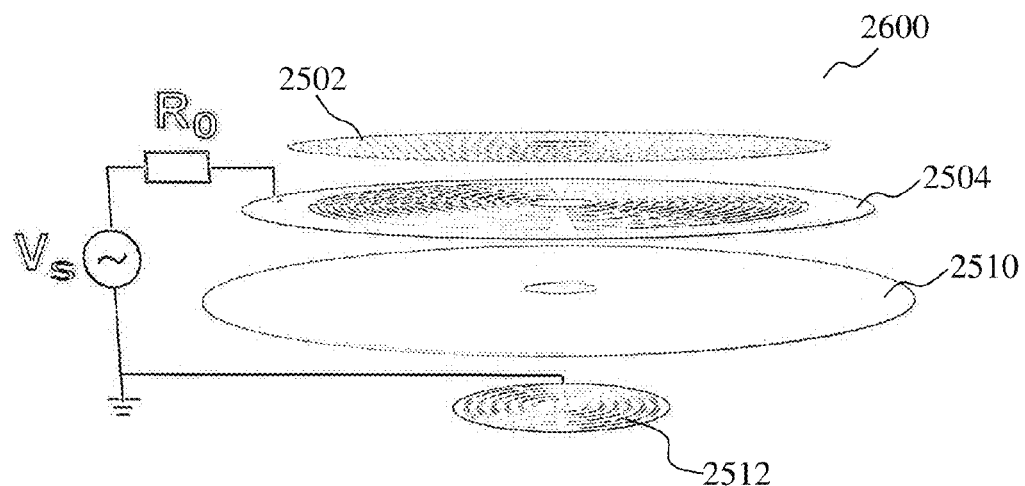
FIG. 26 shows principal components that affect the high speed performance of the integrated graphene modulator of FIG. 25.

FIG. 26 shows a schematic diagram 2600 of the integrated graphene modulator 2500 of FIG. 25. The schematic diagram 2600 shows the main parts of the integrated graphene modulator 2500 that may affect the high frequency performance of the integrated graphene modulator 2500. These main parts are namely the graphene layer 2502, the gating electrode layer 2504, the insulator layer 2510 and the bias electrode layer 2512.

Figure 27:
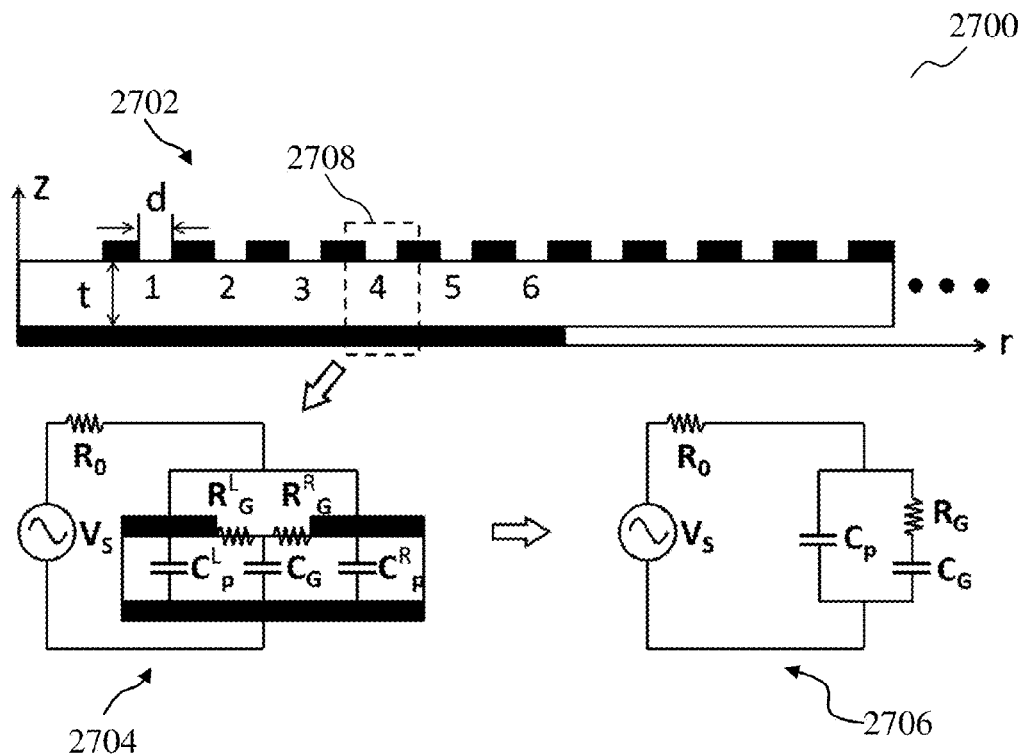
FIG. 27 shows a sequential diagram showing the derivation of an equivalent circuit model for a single slit of an integrated graphene modulator according to various embodiments.

FIG. 27 shows a sequential diagram 2700 showing how the equivalent circuit model of the integrated graphene modulator can be derived. The diagram 2700 includes a cross-sectional schematic view 2702 of the main parts of the integrated graphene modulator that may affect the high frequency performance of the integrated graphene modulator, as shown in the schematic diagram 2600 of FIG. 26; a first circuit 2704; and a second circuit 2706. The cross-sectional schematic view 2702 shows that the integrated graphene modulator has a plurality of slits defined by gratings on the gating electrode layer 2504 of FIG. 26. The slits are numbered as 1, 2, 3, 4, 5, 6 in the cross-sectional schematic view 2702. A single slit 2708 is marked by a dashed box. The first circuit 2704 can be the circuit model for the single slit 2708. The first circuit 2704 includes a resistor $R^L_G$ which models the resistance of the graphene layer from the left contact edge to the center of the graphene layer; and a resistor $R^R_G$ which models the resistance of the graphene layer from the right contact edge to the center of the graphene layer. The first circuit 2704 further includes a capacitor $C_P^L$, which models the capacitance of the left contact pad to the bias electrode layer; and a capacitor $C_p^R$ which models the capacitance of the right contact pad to the bias electrode layer. The first circuit 2704 further includes a capacitor $C_G$ which models the capacitance between the graphene layer and the bias electrode layer. The first circuit 2704 can be simplified to become the second circuit 2706, where the parameters can be expressed as:

$$R_G = \frac{1}{1/R_G^L + 1/R_G^R} \approx \frac{\rho_c + d/2\sigma}{4\pi r} \tag{6}$$

$$C_G = C_p^L + C_p^R = \frac{\varepsilon_{ox}\varepsilon_0(2\pi r d)}{t} \tag{7}$$

where $\rho_c$ is the contact resistance across the metal/graphene edge in unit of $\Omega\cdot\mu m$; $\sigma$ is the graphene conductivity, r is the distance from the center of the slit to the center of the device; t is the thickness of the SiO$_2$, which may be 450 nm; d is the width of the slits (14 μm); $\epsilon_0$ is the vacuum permittivity; and $\epsilon_{ox}$ is the relative permittivity of the SiO$_2$.

Figure 28:
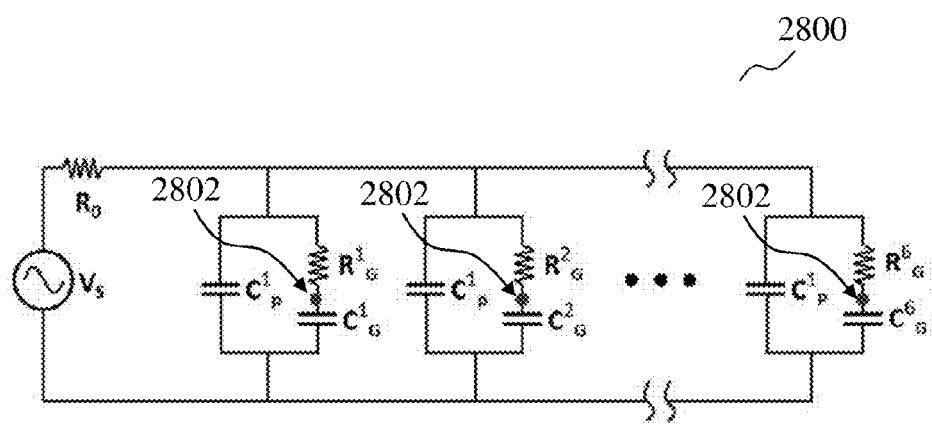
FIG. 28 shows an equivalent circuit which models an entire integrated graphene modulator according to various embodiments.

FIG. 28 shows an equivalent circuit 2800 which models an entire integrated graphene modulator. The equivalent circuit 2800 can be formed by arranging in parallel, the circuit model of the single slit, as obtained in the second circuit 2706 of FIG. 27. Equation (8) can be derived from Equations (6) and (7), as follows:

$$\frac{R_G^1}{C_G^1} = \frac{R_G^2}{C_G^2} = \ldots = \frac{R_G^6}{C_G^6}. \tag{8}$$

This means that the voltages at points 2802 are equal, and therefore, the equivalent circuit 2800 can be further simplified.

Figure 29:
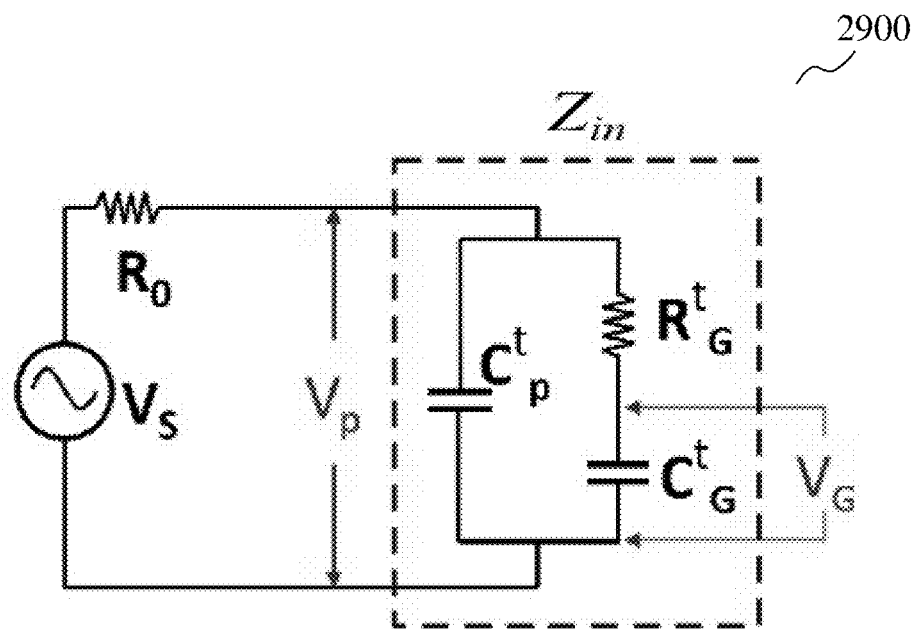
FIG. 29 shows a circuit model which is the simplified equivalent of the equivalent circuit of FIG. 28.

FIG. 29 shows a circuit model 2900 which is the simplified equivalent of the equivalent circuit 2800 of FIG. 28. The circuit parameters of the circuit model 2900 may be expressed as follows:

$$R_G^t = \frac{1}{1/R_G^1 + 1/R_G^2 + \ldots + 1/R_G^6} = \tag{9}$$
$$\frac{\rho_c + d/2\sigma}{4\pi}\left(\frac{1}{r_1 + r_2 + \ldots + r_6}\right) \approx \frac{\rho_c}{10^4\,um} + \frac{2\times 10^{-4}}{\sigma} \approx 180\,\Omega$$

$$C_G^t = \tag{10}$$
$$C_G^1 + C_G^2 + \ldots + C_G^6 = \frac{2\pi\varepsilon_{SiO_2}\varepsilon_0 d}{t}(r_1 + r_2 + \ldots + r_6) \approx 6.5\,\text{pF}$$

$$C_p^t = C_p^1 + C_p^2 + \ldots + C_p^6 = \frac{\varepsilon_{SiO_2}\varepsilon_0 A_p}{t} \approx 8.7\,\text{pF} \tag{11}$$

where in Equation (9), $\rho_c(R_{contact}/2)\times l_{contact}\approx(440\,\Omega/2)\times 8000$ um, $R_{contact}$ being the contact resistance obtained through the graph 2200 of FIG. 22; and $l_{contact}$ being the length of the graphene/metal edge of that separated device, with $A_p$ being the total area of the graphene contact for slit 1 to 6.

Based on the circuit model, the applied gate voltage can be calculated as $$V_p = V_s \times \frac{Z_{in}}{Z_{in} + R_0} \tag{12}$$

where $Z_{in}$ is the total impedance of the modulator, enclosed by the dashed box in the circuit model 2900. $Z_{in}$ can be expressed as:

$$Z_{in} = \frac{[R_G^t + (1/i\omega C_G^t)](1/i\omega C_p^t)}{R_G^t + (1/i\omega C_G^t) + (1/i\omega C_p^t)}. \tag{13}$$

where $\omega=2\pi f$ with f being the frequency of the modulation signal $V_S$. The signal $V_G$ that drives the carriers in and out of the graphene can be expressed as:

$$V_G = V_S \times \frac{Z_{in}}{Z_{in} + R_0} \times \frac{1}{1 + i\omega R_G^t C_G^t} \tag{14}$$
$$= V_S \times \frac{1}{1 + i\omega R_0 C_p^t + R_0/(R_G^t + 1/i\omega C_G^t)} \times \frac{1}{1 + i\omega R_G^t C_G^t}$$

Figure 30:
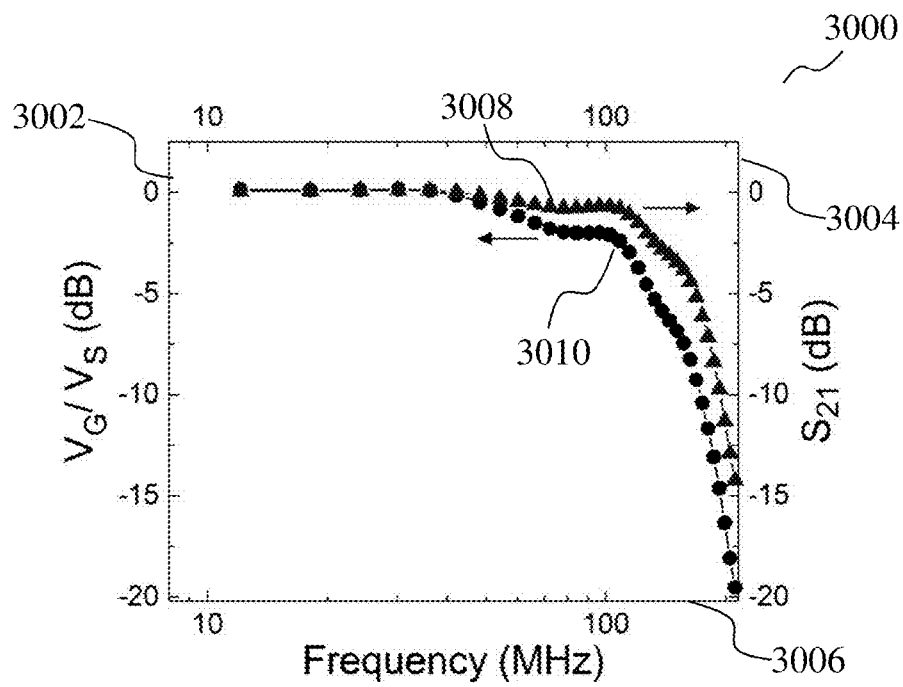
FIG. 30 shows a graph showing the dynamic response of the integrated graphene modulator and the electrical modulation applied to the graphene layer according to various embodiments.

FIG. 30 shows a graph 3000 showing the dynamic response ($S_{21}$) of the integrated graphene modulator and the electrical modulation applied to the graphene layer. The graph 3000 includes a first vertical axis 3002 indicating a ratio of $V_G$ to $V_S$ in decibels; a second vertical axis 3004 indicating $S_{21}$ in decibels; and a horizontal axis 3006 indicating frequency in MHz. The graph 3000 further include a first plot 3008 which shows the $S_{21}$ response of the integrated graphene modulator; and a second plot 3010 which shows the electrical modulation applied to the graphene layer of the integrated graphene modulator. The dynamic response ($S_{21}$) can be used to characterize the high-frequency response of the integrated graphene modulator. The S-parameters can be measured using a radio frequency (RF) network analyzer. The relation between $S_{21}$ and $Z_{in}$ for the circuit model 2900 of FIG. 29 can be expressed as:

$$S_{21} = \frac{2Z_{in}}{2Z_{in} + R_0} \tag{15}$$

Equation (16) can be obtained by combining Equations (13)-(15):

$$V_G = V_S \times \frac{1}{2/S_{21} - 1} \times \frac{1}{1 + i\omega R_G^t C_G^t} \tag{16}$$

The second plot 3010 can be plotted by using the estimated values $R_G^t \approx 180\Omega$ and $C_G^t \approx 6.5$ pF to obtain the normalized modulation depth ($V_G/V_S$) of the electrical signal applied to the graphene layer as a function of the modulation frequency. From the second plot 3010, the 3-dB cutoff frequency is estimated to be 110 MHz.

While embodiments of the invention have been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced. It will be appreciated that common numerals, used in the relevant drawings, refer to components that serve a similar or the same purpose.

The invention claimed is:

1. A layer arrangement comprising:
    a graphene layer;
    a gating electrode layer configured to provide a tuning voltage to the graphene layer;
    a laser layer configured to provide an electromagnetic wave, the laser layer comprising an active region, the active region being un-etched; and
    a concentric-circular grating layer configured to couple the electromagnetic wave to the graphene layer, the concentric-circular grating layer comprising a plurality of concentric rings,
    wherein innermost rings of the plurality of concentric rings are electrically connected together, and outer rings of the plurality of concentric rings are electrically unconnected to the innermost rings,
    wherein the innermost rings are configured to electrically pump the active region.

2. The layer arrangement of claim 1, wherein the graphene layer is provided above the gating electrode layer.

3. The layer arrangement of claim 2, further comprising:
    an insulator layer arranged between the concentric-circular grating layer and the gating electrode layer.

4. The layer arrangement of claim 3, wherein the gating electrode layer is provided above the insulator layer.

5. The layer arrangement of claim 3, wherein the insulator layer is provided above the concentric-circular grating layer.

6. The layer arrangement of claim 1, wherein the concentric-circular grating layer is provided above the laser layer.

7. The layer arrangement of claim 1, wherein the laser layer comprises a quantum cascade laser.

8. The layer arrangement of claim 1, wherein the active region is at least substantially flat.

9. The layer arrangement of claim 1, wherein the concentric-circular grating layer comprises at least one spoke bridge.

10. The layer arrangement of claim 9, wherein the set of innermost rings are connected together through the at least one spoke bridge.

11. The layer arrangement of claim 10, wherein the set of innermost rings connected through the at least one spoke bridge is configured to provide electrical pumping to a layer underneath the set of innermost rings.

12. The layer arrangement of claim 10, wherein the set of innermost rings are arranged over the active region of the laser layer.

13. The layer arrangement of claim 1, wherein the concentric-circular grating layer provides a laser cavity.

14. The layer arrangement of claim 1, wherein the graphene layer is configured to modulate the electromagnetic wave based on the tuning voltage.

15. The layer arrangement of claim 1, wherein a frequency of the electromagnetic wave is at least substantially in a range of terahertz.

16. A method for fabricating a layer arrangement, the method comprising:
    providing a graphene layer;
    providing a gating electrode layer configured to provide a tuning voltage to the graphene layer;
    providing a laser layer configured to provide an electromagnetic wave, the laser layer comprising an active region, the active region being un-etched; and
    providing a concentric-circular grating layer configured to couple the electromagnetic wave to the graphene layer, the concentric-circular grating layer comprising a plurality of concentric rings, wherein innermost rings of the plurality of concentric rings are electrically connected together, outer rings of the plurality of concentric rings are electrically unconnected to the innermost rings, and the innermost rings are configured to electrically pump the active region.

17. The method of claim 16, wherein providing the graphene layer comprises spin-coating a graphene sheet with a film.

18. The method of claim 16, wherein providing the laser layer comprises removal of an absorptive contact layer of the active region.

19. The method of claim 16, wherein providing the concentric-circular grating layer comprises etching of a plurality of metal gratings.

20. The layer arrangement of claim 1, further comprising:
    a bias electrode within the concentric-circular grating layer,
    wherein the tuning voltage is applied between the bias electrode and the gating electrode layer.

21. The layer arrangement of claim 20, further comprising:
    an insulator layer arranged between the bias electrode and the gating electrode layer.

22. The layer arrangement of claim 1, wherein an electric field of the electromagnetic wave is confined to an area electrically pumped by the innermost rings.

* * * * *